(12) United States Patent
Abe et al.

(10) Patent No.: US 10,229,959 B2
(45) Date of Patent: Mar. 12, 2019

(54) ORGANIC EL DISPLAY PANEL AND METHOD OF MANUFACTURING ORGANIC EL DISPLAY PANEL

(71) Applicant: JOLED INC., Tokyo (JP)

(72) Inventors: Kaoru Abe, Tokyo (JP); Takashi Osako, Tokyo (JP); Kenichi Nendai, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/672,539

(22) Filed: Aug. 9, 2017

(65) Prior Publication Data

US 2018/0047798 A1 Feb. 15, 2018

(30) Foreign Application Priority Data

Aug. 10, 2016 (JP) .................................. 2016-157862

(51) Int. Cl.
*H01L 27/32* (2006.01)
*H01L 51/52* (2006.01)
(Continued)

(52) U.S. Cl.
CPC ........ *H01L 27/3246* (2013.01); *H01L 27/322* (2013.01); *H01L 27/3248* (2013.01);
(Continued)

(58) Field of Classification Search
CPC .............. H01L 27/3246; H01L 27/322; H01L 27/3248; H01L 51/0097; H01L 51/5218;
(Continued)

(56) References Cited

U.S. PATENT DOCUMENTS 5,443,922 A 8/1995 Nishizaki et al.
7,294,856 B2 * 11/2007 Ito ....................... H01L 27/3246
257/13
(Continued)

FOREIGN PATENT DOCUMENTS

EP 2 451 251 * 5/2012 .......... H01L 27/3211
JP 05-163488 6/1993
(Continued)

OTHER PUBLICATIONS

Bar Code Labels of DuPont Kapton, pp. 1-2, 2001.*

*Primary Examiner* — Mary Wilczewski
(74) *Attorney, Agent, or Firm* — Greenblum & Bernstein, P.L.C.

(57) ABSTRACT

An organic electroluminescence (EL) display panel including pixels arranged in a matrix, the organic EL display panel includes: a substrate; pixel electrode layers made of a light-reflective material and arranged on the substrate in a matrix; an insulating layer provided at least above row and column outer edges of the pixel electrode layers and above inter-regions on the substrate between the row and column outer edges; an organic functional layer provided above the pixel electrode layers; and a counter electrode layer made of a light-transmissive material and is provided above the organic functional layer, wherein the organic functional layer includes light-emitting layers that are provided in regions above the pixel electrode layers where the insulating layer is not provided, the light-emitting layers causing organic electroluminescence, and the insulating layer has an optical density of 0.5 to 1.5 in a direction of the substrate when viewed in plan.

18 Claims, 22 Drawing Sheets

(51) Int. Cl.
*H01L 51/54* (2006.01)
*H01L 51/00* (2006.01)

(52) U.S. Cl.
CPC ...... *H01L 27/3272* (2013.01); *H01L 51/0097* (2013.01); *H01L 51/5218* (2013.01); *H01L 27/3211* (2013.01); *H01L 27/3283* (2013.01); *H01L 2227/323* (2013.01); *H01L 2251/5315* (2013.01); *H01L 2251/5338* (2013.01)

(58) Field of Classification Search
CPC ....... H01L 2227/323; H01L 2251/5315; H01L 2251/5338; H01L 27/3211; H01L 27/3283; H01L 27/3272
See application file for complete search history.

(56) References Cited

U.S. PATENT DOCUMENTS

| | | | |
|---|---|---|---|
| 7,336,030 B2 * | 2/2008 | Funamoto | H01L 27/3246 313/506 |
| 7,795,809 B2 * | 9/2010 | Ito | H01L 27/3246 257/79 |
| 8,094,096 B2 * | 1/2012 | Okumoto | H01L 27/3246 345/204 |
| 8,217,573 B2 * | 7/2012 | Yoshida | H01L 27/3246 313/504 |
| 8,304,986 B2 * | 11/2012 | Yoshida | H01L 27/3211 313/504 |
| 8,530,922 B2 * | 9/2013 | Nakatani | H01L 51/5088 257/40 |
| 8,729,534 B2 * | 5/2014 | Yoshida | H01L 27/3211 257/40 |
| 8,901,894 B2 * | 12/2014 | Sato | H02J 7/00 320/136 |
| 9,786,726 B2 * | 10/2017 | Hashimoto | H01L 51/5092 |
| 2004/0119408 A1 | 6/2004 | Ryu | |
| 2011/0101857 A1 | 5/2011 | Kanatani et al. | |
| 2011/0198990 A1 * | 8/2011 | Yoshida | H01L 27/3211 313/504 |
| 2012/0112217 A1 * | 5/2012 | Yoshida | H01L 27/3211 257/89 |
| 2012/0228602 A1 * | 9/2012 | Nakatani | H01L 51/5088 257/40 |
| 2014/0367675 A1 | 12/2014 | Tsukamoto et al. | |
| 2016/0133677 A1 * | 5/2016 | Yamamoto | H01L 27/3246 257/40 |
| 2016/0329388 A1 * | 11/2016 | Yokota | H01L 27/3246 |
| 2016/0351637 A1 * | 12/2016 | Hashimoto | H01L 51/5092 |
| 2018/0047798 A1 * | 2/2018 | Abe | H01L 27/3246 |
| 2018/0123076 A1 * | 5/2018 | Fukuda | H01L 27/3211 |

FOREIGN PATENT DOCUMENTS

| | | | | |
|---|---|---|---|---|
| JP | 2002-208475 | | 7/2002 | |
| JP | 2004-087496 | | 3/2004 | |
| JP | 4601724 | | 12/2010 | |
| JP | 5019701 | | 6/2012 | |
| WO | WO 2011/001614 | * | 1/2011 | ......... H01L 27/3211 |
| WO | 2012/032662 | | 3/2012 | |
| WO | 2013/108783 | | 7/2013 | |

* cited by examiner

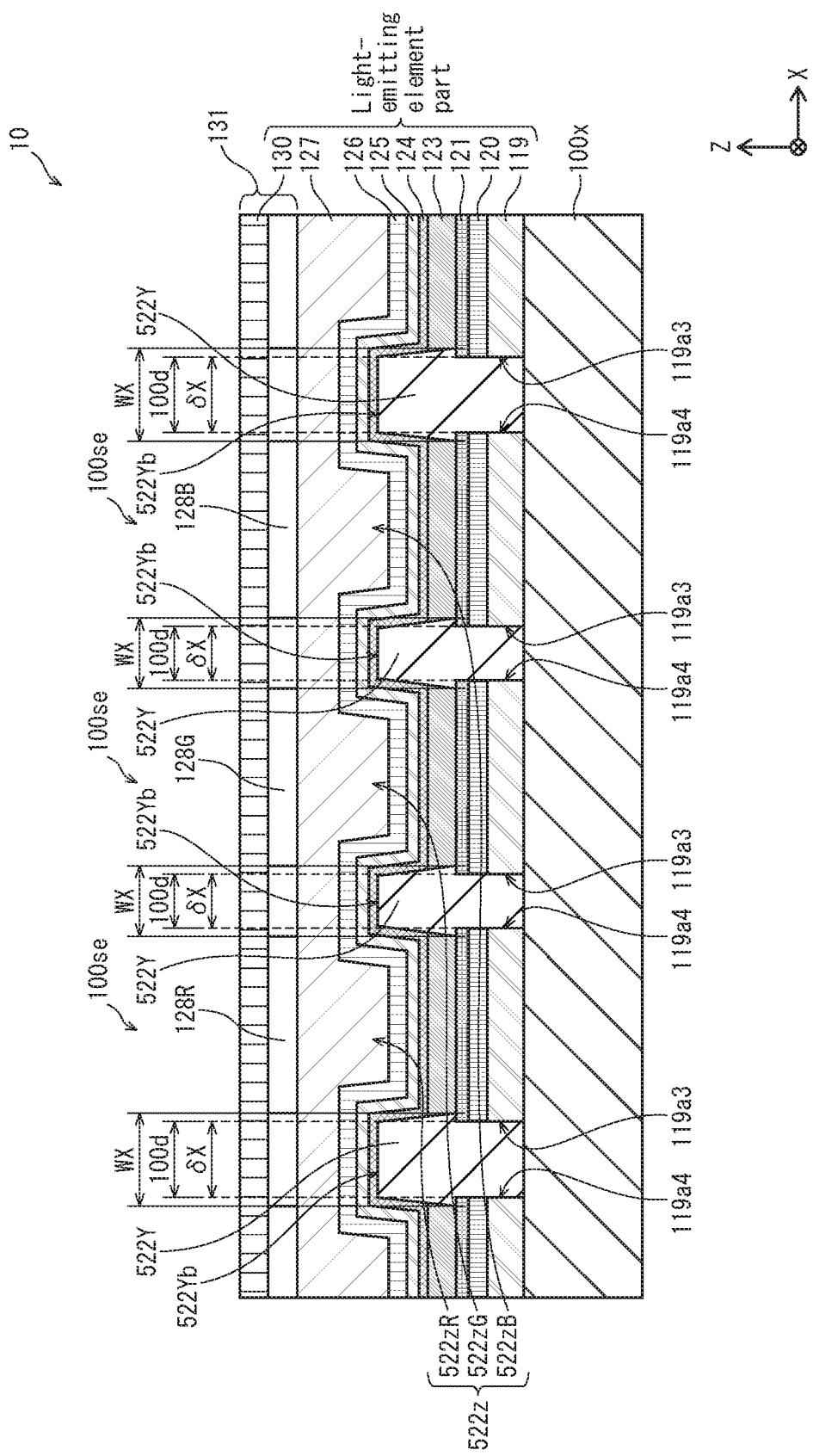

FIG. 10A
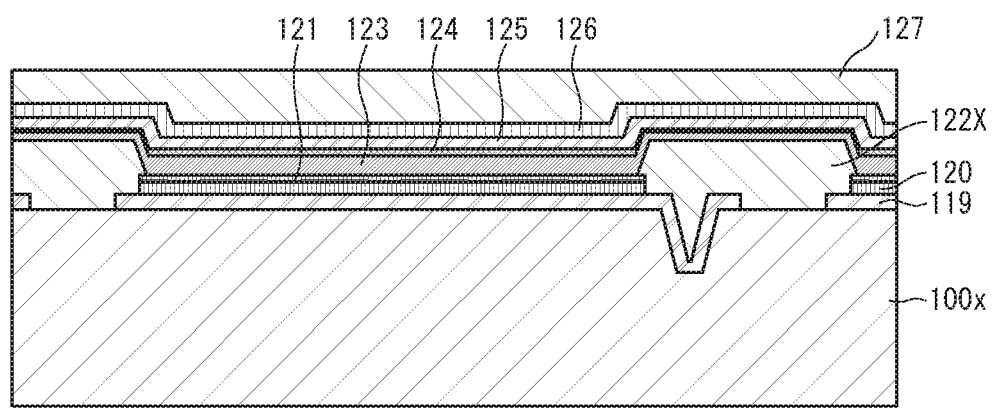
FIG. 10B
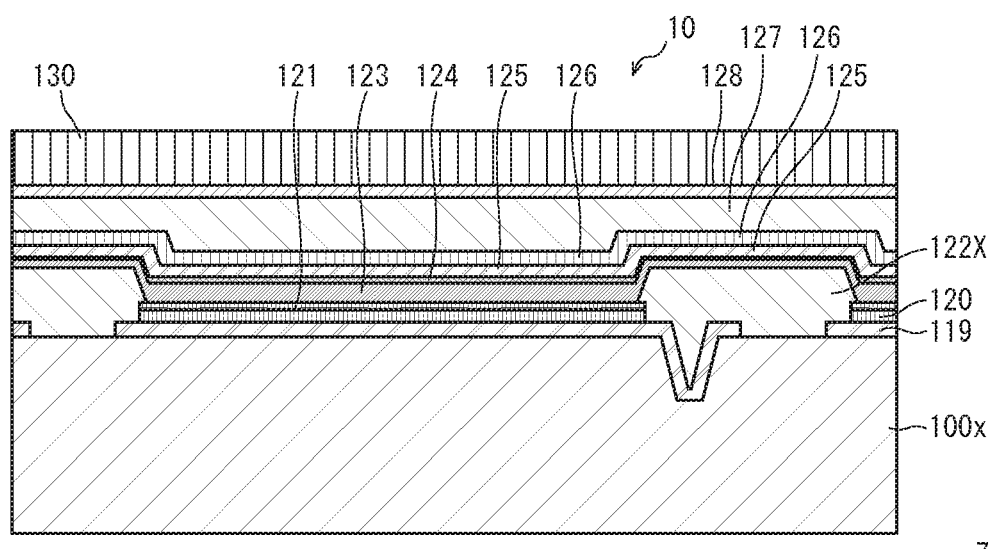
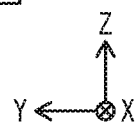

FIG. 12A
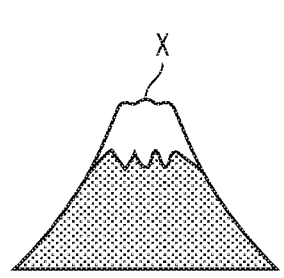 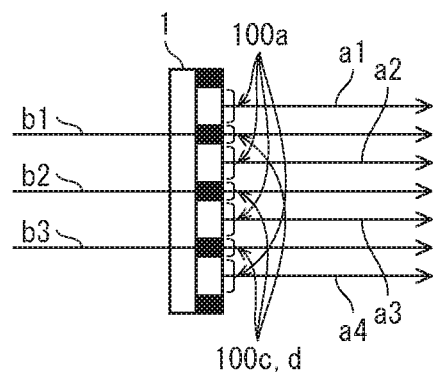 
FIG. 12B
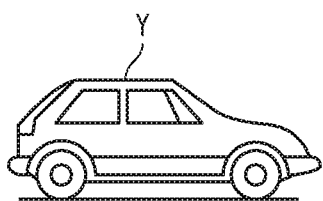 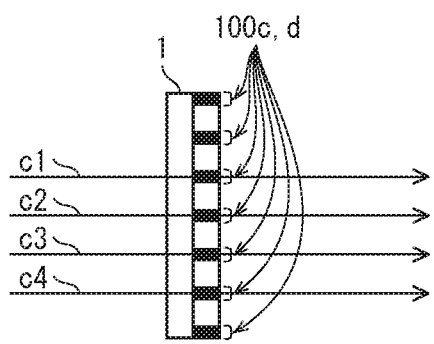 
FIG. 12C
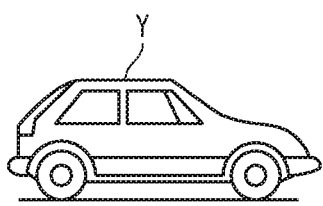 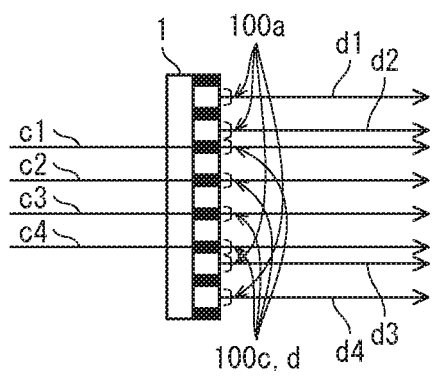 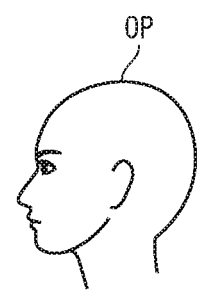

ORGANIC EL DISPLAY PANEL AND METHOD OF MANUFACTURING ORGANIC EL DISPLAY PANEL

This application is based on an application No. 2016-157862 filed in Japan, the contents of which are hereby incorporated by reference.

BACKGROUND OF THE DISCLOSURE (1) Technical Field

The present disclosure relates to organic electroluminescence (EL) display panels that use organic EL elements that make use of electroluminescence of organic material, and to a method of manufacturing the same.

(2) Description of Related Art

In recent years, as display panels used in display devices such as digital televisions, organic EL display panels are being implemented in which a plurality of organic EL elements are arrayed in a matrix on a substrate. Such organic EL display panels have high visibility, because each organic EL element is self-luminous.

In an organic EL display panel, each organic EL element has a basic structure in which a light-emitting layer containing an organic light-emitting material is disposed between an anode and cathode electrode pair, and when driven, a voltage is applied between the electrode pair and light is emitted through recombination of holes injected to the light-emitting layer from the anode and electrons injected to the light-emitting layer from the cathode.

In an organic EL display panel, organic EL elements of a light-emitting layer are typically separated from adjacent organic EL elements by an insulating layer composed of an insulating material. In an organic EL display panel for color display, such organic EL elements form R, G, and B pixels, and adjacent R, G, and B pixels combine to form unit pixels in color display.

Typically, in an organic EL display panel, in order to prevent a decrease in contrast of display due to reflection of external light at an outer edge of a reflective electrode provided to each pixel, a light shielding layer is provided in a lattice form at boundaries between adjacent pixels above the insulating layer. For example, WO 2013108783 discloses an organic EL element that suppresses a decrease in aperture ratio while also preventing color mixing between adjacent pixels, by using a matrix-shaped light-shielding member that has different thicknesses above a color filter substrate.

SUMMARY OF THE DISCLOSURE (1) Problem to be Solved

In the case of an organic EL display panel in which a light shielding layer is carried on a color filter substrate that opposes a display element substrate, a position shift occurring at the time of alignment for sealing between the color filter substrate and the display element substrate, leading to outer edges of reflective electrode layers protruding from a light shielding layer, can cause a problem of a decrease in display contrast due to reflection of external light at the protruding outer edges.

In a case of an increase in width of the light shielding layer in order to prevent such protrusion, light from display elements is interfered with by and absorbed by the light shielding layer, and therefore light extraction efficiency decreases and luminance/chromaticity nonconformity occurs according to viewing angle. As resolution of display panels increases, element area for each unit pixel is reduced, but width of a shielding layer required to prevent light leakage to adjacent pixels is maintained. Thus, aperture ratio of the light shielding layer per unit pixel decreases as the resolution increases, and there is a concern that maintaining light extraction efficiency and uniformity of luminance/chromaticity becomes more difficult.

The present disclosure is achieved in view of the above-described problem, and an object of the present disclosure is to provide an organic EL display panel of a top-emission type with an excellent contrast by suppression of external light reflection at outer edges of reflective pixel electrode layers, and to provide a manufacturing method suitable for manufacture of the organic EL display panel.

(2) Means for Solving Problem

One aspect of the present disclosure is an organic electroluminescence (EL) display panel including a plurality of pixels arranged in a matrix, the organic EL display panel comprising: a substrate; a plurality of pixel electrode layers that are made of a light-reflective material and are arranged on the substrate in a matrix; an insulating layer that is provided at least above row and column outer edges of the pixel electrode layers and above inter-regions on the substrate between the row and column outer edges; an organic functional layer that is provided above the pixel electrode layers; and a counter electrode layer that is made of a light-transmissive material and is provided above the organic functional layer, wherein the organic functional layer includes a plurality of light-emitting layers that are provided in regions above the pixel electrode layers where the insulating layer is not provided, the light-emitting layers causing organic electroluminescence, and the insulating layer has an optical density of 0.5 to 1.5 in a direction of the substrate when viewed in plan.

According to the organic EL display panel relating to the aspect of the present disclosure, it is possible to suppress a decrease in display contrast due to reflection of external light at the outer edges of the reflective pixel electrode layers.

BRIEF DESCRIPTION OF THE DRAWINGS

These and other objects, advantages, and features of the technology relating to the present disclosure will become apparent from the following description thereof taken in conjunction with the accompanying drawings, which illustrate at least one specific embodiment of the technology relating to the present disclosure.

FIG. 7 is a schematic cross-sectional view taken along a line B-B in FIG. 3.

FIG. 10A and FIG. 10B are schematic cross-sectional views showing a process of bonding a CF substrate 131 to a rear panel in manufacture of the organic EL display panel 10, taken along a line at the same position as the line A-A in FIG. 3.

FIG. 12A-FIG. 12C are schematic diagrams for describing functions of the organic EL display device 1 when the display panel 10 is used as a transmissive display panel.

DESCRIPTION OF EMBODIMENTS

<Summary of Embodiments>

Figure 1:
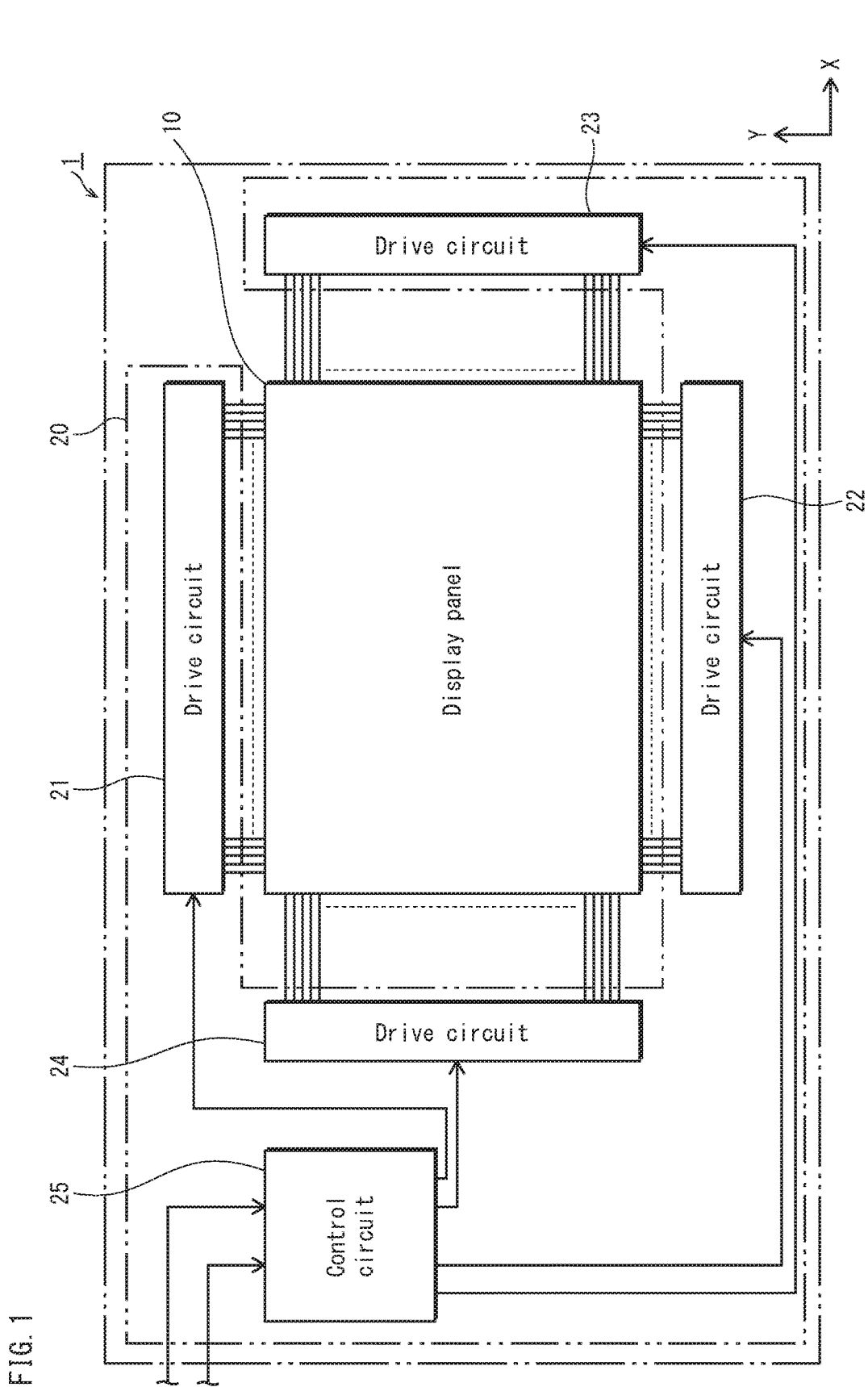
FIG. 1 is a schematic block diagram showing a circuit configuration of an organic EL display device 1 relating to an embodiment.

One aspect of the present disclosure is an organic electroluminescence (EL) display panel including a plurality of pixels arranged in a matrix, the organic EL display panel comprising: a substrate; a plurality of pixel electrode layers that are made of a light-reflective material and are arranged on the substrate in a matrix; an insulating layer that is provided at least above row and column outer edges of the pixel electrode layers and above inter-regions on the substrate between the row and column outer edges; an organic functional layer that is provided above the pixel electrode layers; and a counter electrode layer that is made of a light-transmissive material and is provided above the organic functional layer, wherein the organic functional layer includes a plurality of light-emitting layers that are provided in regions above the pixel electrode layers where the insulating layer is not provided, the light-emitting layers causing organic electroluminescence, and the insulating layer has an optical density of 0.5 to 1.5 in a direction of the substrate when viewed in plan. With this configuration, it is possible to suppress a decrease in display contrast due to reflection of external light at the outer edges of the reflective pixel electrode layers.

Also, according to another aspect, in the above configuration, the substrate may be made of a light-transmissive material, and light entering from a rear surface of the substrate may at least transmit through the inter-regions and is emitted upward. With this configuration, an observer can selectively or simultaneously view light that enters from a rear surface of the display device, transmits through the inter-regions, and is emitted upward above the display device and light that is emitted from self-luminous regions that are positioned at a peripheral part of the display device.

Also, according to another aspect, in the above configuration, the insulating layer may include: a plurality of column insulating sublayers that are provided at least above the row outer edges of the pixel electrode layers and above the inter-regions on the substrate between the row outer edges; and a plurality of row insulating sublayers that are provided at least above the column outer edges of the pixel electrode layers and above the inter-regions on the substrate between the column outer edges, and the light-emitting layers may be each provided in a gap between two adjacent of the column insulating sublayers. With this configuration, in a display panel including an insulating layer having a so-called line shape, it is possible to suppress a decrease in display contrast due to reflection of external light at the outer edges of the reflective pixel electrode layers.

Also, according to another aspect, in the above configuration, the row insulating sublayers may have a higher optical density than the column insulating sublayers. With this configuration, it is possible to further effectively suppress a problem that light entering from above the upper substrate in the column direction is strongly reflected at the outer edges of the reflective pixel electrode layers in the row direction. This problem is further prominent in a typical installation condition of display panels.

Also, according to another aspect, in the above configuration, the row insulating sublayers may have a lower liquid repellency against an organic solvent than the column insulating sublayers. With this configuration, it is possible to set both liquid philicity of the column insulating sublayers to ink and liquid repellency of the row insulating sublayers against ink that fall within an acceptable range in process. Specifically, the column insulating sublayers define the row outer edges of the light-emitting layers which are formed by stemming the flow in the column direction of the ink containing organic compound as the material of the light-emitting layers, and the row insulating sublayers control the flow in the column direction of the ink containing organic compound as the material of the light-emitting layers.

Also, according to another aspect, in the above configuration, the light-emitting layers may be continuous on the row insulating sublayers in the column direction. With this configuration, a great irregular thickness in the column direction is not likely to occur, and thus an irregular luminance between pixels is improved.

Also, according to another aspect, in the above configuration, the organic EL display panel may further comprise a plurality of column banks that are provided, on part of the insulating layer, at least above the row outer edges of the pixel electrode layers and above the inter-regions on the substrate between the row outer edges. With this configuration, in a display panel adopting an insulating layer having a so-called lattice shape, it is possible to suppress a decrease in display contrast due to reflection of an external light at the outer edges of the reflective pixel electrode layers.

Also, according to another aspect, in the above configuration, the insulating layer may have a higher optical density than the column banks. Even in the case where an addition rate of black pigment in the column banks is decreased in order to increase liquid repellency of the light-emitting layers against ink, it is possible to suppress a decrease in display contrast due to reflection of external light at the outer edges of the reflective pixel electrode layers by increasing an addition rate of black pigment in the column insulating sublayers that are disposed on the column banks, thereby to ensure a certain optical density.

Also, according to another aspect, in the above configuration, the column banks may have a higher liquid repellency against an organic solvent than the insulating layer. With this configuration, it is possible to form the column banks and the column insulating sublayers, which are arranged on the column banks, by using different materials, thereby independently setting the addition rate of black pigment in the column banks and the column insulating sublayers. This facilitates appropriate control on liquid repellency of the light-emitting layers 123 against ink. Specifically, even in the case where the column insulating layers and the row insulating sublayers, which are layered on the upper surface of the substrate, are made of the same material, the following configurations are easily achieved: the addition rate of black pigment in the column banks is decreased, and thereby the column banks define the row outer edges of the light-emitting layers which are formed by stemming the flow in the column direction of the ink containing organic compound as the material of the light-emitting layers; and the addition rate of black pigment in the row insulating sublayers is increased, and thereby the row insulating sublayers control the flow in the column direction of the ink containing organic compound as the material of the light-emitting layers.

Also, according to another aspect, in the above configuration, when the substrate is viewed in plan, in one subpixel emitting red, green, or blue light, the inter-region may have an area that is 10% to 120% of an area of a self-luminescent region on the pixel electrode layer where the insulating layer is not provided. With this configuration, an observer can selectively or simultaneously view light that enters from a rear surface of the display device, transmits through the inter-regions, and is emitted upward above the display device and light that is emitted from self-luminous regions that are positioned at a peripheral part of the display device.

Also, according to another aspect, in the above configuration, the insulating layer may contain a resin binder and at least one component selected from carbon, molybdenum, and chromium. With this configuration, it is possible to manufacture insulating layers having optical density of 0.5 to 1.5 when the substrate is viewed in plan.

Also, according to another aspect, in the above configuration, the organic EL display panel may further comprise an upper substrate that is made of a light-transmissive material and is provided above the counter electrode layer, wherein a light shielding layer may be not provided on a part of the upper substrate above the row and column outer edges of the pixel electrode layers. With this configuration, it is not necessary to perform positional adjustment with a high precision for bonding a light shielding layer of a CF substrate and pixels of the rear panel to each other while relative positional relationship therebetween is maintained. Especially in the configuration in which a color filter layer of a different color for each pixel is not provided on the CF substrate, positioning between the rear panel and the CF substrate can be omitted. Moreover, even in the case where the display panel does not include the CF substrate, for example in the case where the display panel is a transparent display, it is possible to suppress reflection of external light and improve the luminous efficiency.

Also, according to another aspect, in the above configuration, the substrate may be flexible. With this configuration, it is possible to attach the display device to curved windows for driving and the like of vehicles thereby to display running information and the like on the display device.

<Embodiments>

1. Circuit Configuration of Display Device 1

The following describes a circuit configuration of an organic EL display device 1 (hereinafter, referred to just as display device 1) relating to the embodiment, with reference to FIG. 1.

As shown in FIG. 1, the display device 1 includes an organic EL display panel 10 (hereinafter, referred to just as display panel 10) and a drive control circuit 20 connected thereto.

The display panel 10 is an organic electroluminescence (EL) panel that makes use of electroluminescence of organic material, in which organic EL elements are arrayed in a matrix, for example. The drive control circuit 20 includes four drive circuits 21 to 24 and a control circuit 25.

The arrangement of the circuits of the drive control circuit 20 with respect to the display panel 10 in the display device 1 is not limited to the configuration shown in FIG. 1.

2. Circuit Configuration of Display Panel 10

The display panel 10 includes a plurality organic EL elements that are unit pixels 100e each of which are composed of three-color subpixels (not shown) emitting light of red (R), green (G), and blue (B) colors. Circuit configuration of the subpixels 100se is described with reference to FIG. 2.

Figure 2:
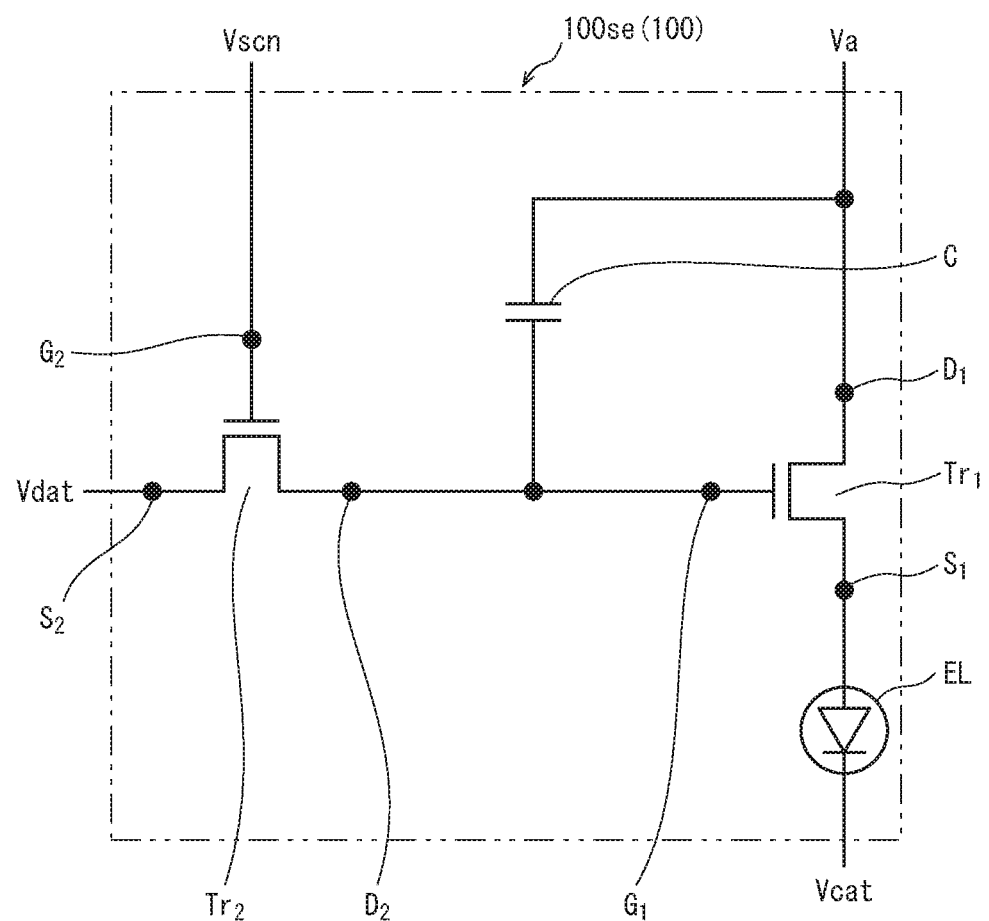
FIG. 2 is a schematic circuit diagram showing a circuit configuration of each subpixel 100se of an organic EL display panel 10 used in the organic EL display device 1.

FIG. 2 is a schematic circuit diagram showing the circuit configuration of an organic EL display element 100 corresponding to each subpixel 100se of the display panel 10 used in the display device 1. The organic EL display elements 100 each constituting the unit pixel 100e are arranged in a matrix as a display region of the display panel 10.

In the display panel 10 relating to the present embodiment, as shown in FIG. 2, each subpixel 100se includes two transistors $Tr_1$ and $Tr_2$, one volume C, and an organic EL element unit EL as a light-emitting unit. The transistor $Tr_1$ is a drive transistor, and the transistor $Tr_2$ is a switching transistor.

A gate $G_2$ and a source $S_2$ of the switching transistor Tr2 are connected to a scanning line Vscn and a data line Vdat, respectively. A drain $D_2$ of the switching transistor Tr2 is connected to a gate $G_1$ of the drive transistor $Tr_1$.

A drain $D_1$ and source $S_1$ of the drive transistor $Tr_1$ is connected to a power line Va and a pixel electrode layer (anode) of the organic EL element unit EL. A counter electrode layer (cathode) of the organic EL element unit EL is connected to a ground line Vcat.

Note that the volume C is provided so as to connect between the drain D, of the switching transistor Tr2, the gate $G_1$ of the drive transistor $Tr_1$, and the power line Va.

In the display panel 10, one unit pixel 100e is composed of a combination of adjacent subpixels 100se (for example, three subpixels 100se of red (R), green (G), and blue (B) luminescent colors), and a pixel region is composed of the subpixels 100se that are distributed. A gate line GL is extracted from the gate G, of each subpixel 100se, and is connected to the scanning line Vscn that is connected from the outside of the display panel 10. Similarly, a source line SL is extracted from the source $S_2$ of each subpixel 100se, and is connected to the data line Vdat that is connected from the outside of the display panel 10.

Furthermore, the power line Va and the ground line Vcat of each subpixel 100se are collectively connected to the power line Va and the ground line Vcat.

3. Overall Configuration of Display Panel 10

The following describes the display panel 10 relating to the present embodiment with reference to the drawings. Note that the drawings are pattern diagrams, and the scale reduction thereof may differ from the actual scale reduction.

Figure 3:
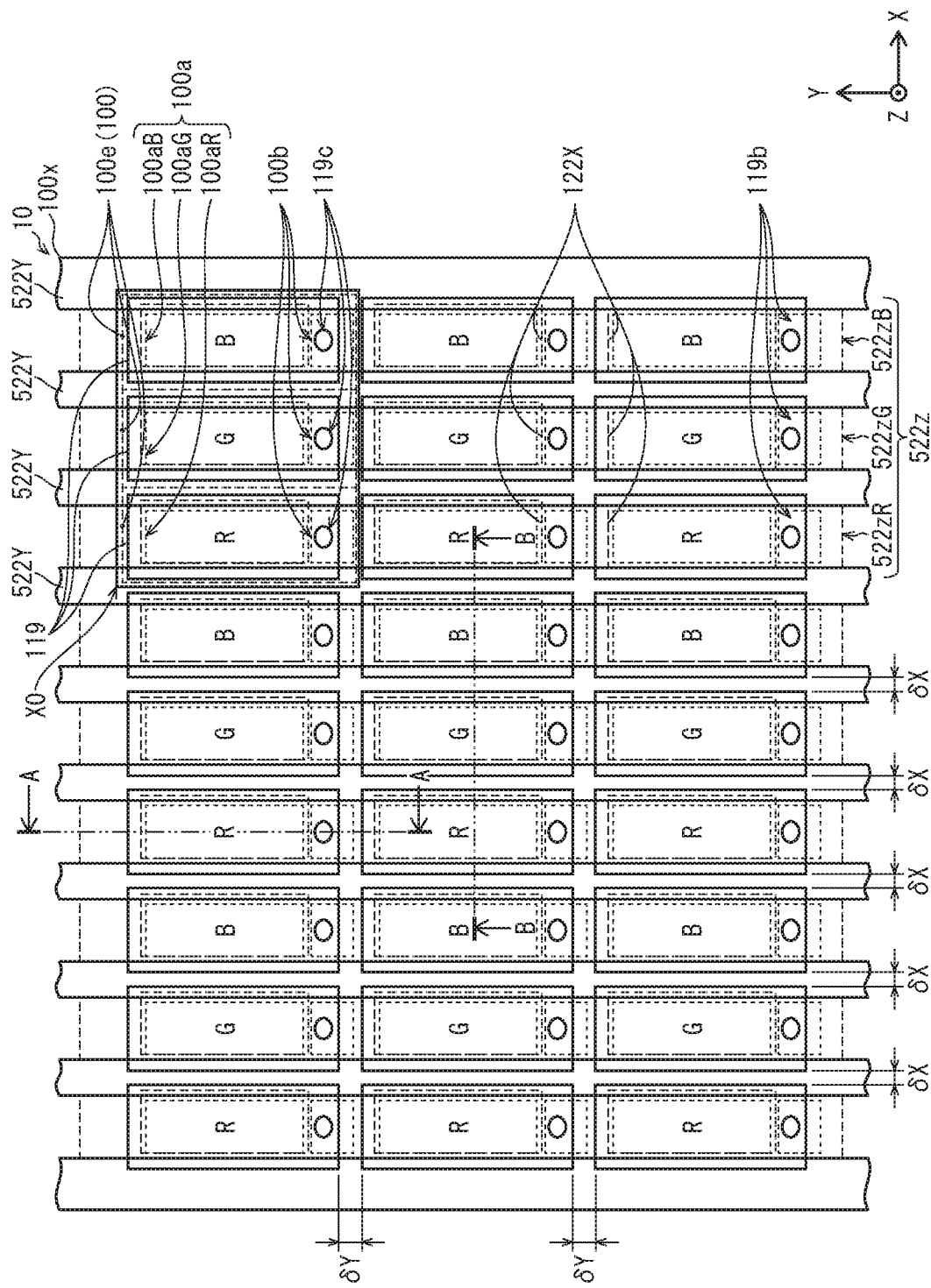
FIG. 3 is a schematic plan view showing a portion of the organic EL display panel 10.
Figure 4:
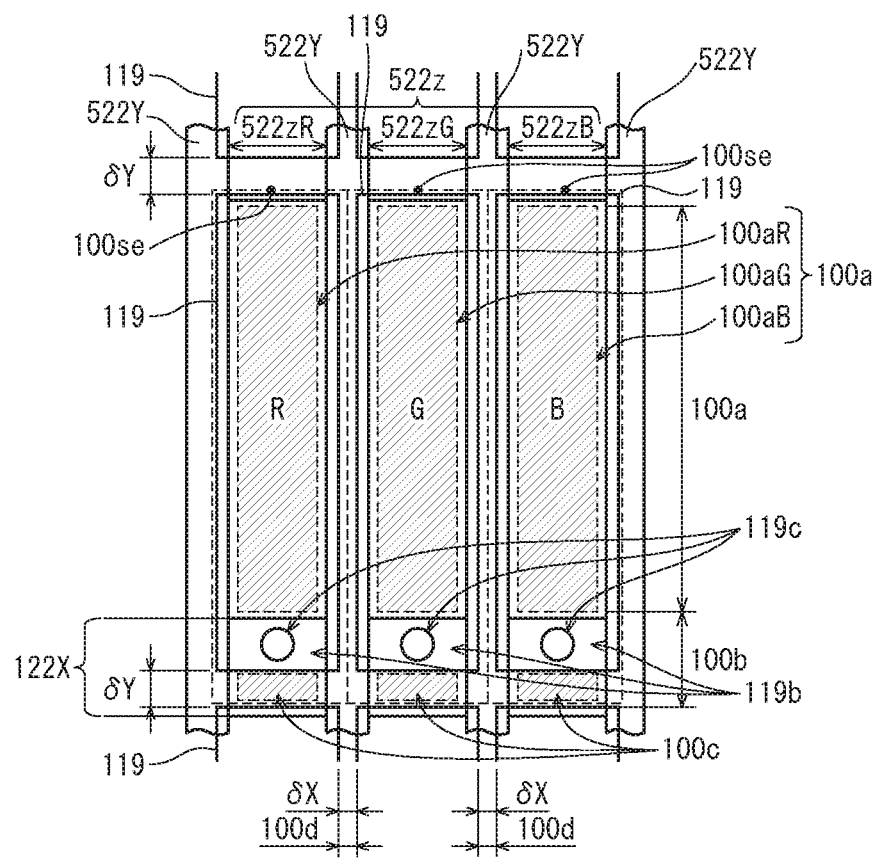
FIG. 4 is an enlarged plan view of a portion X0 in FIG. 3.
Figure 5:
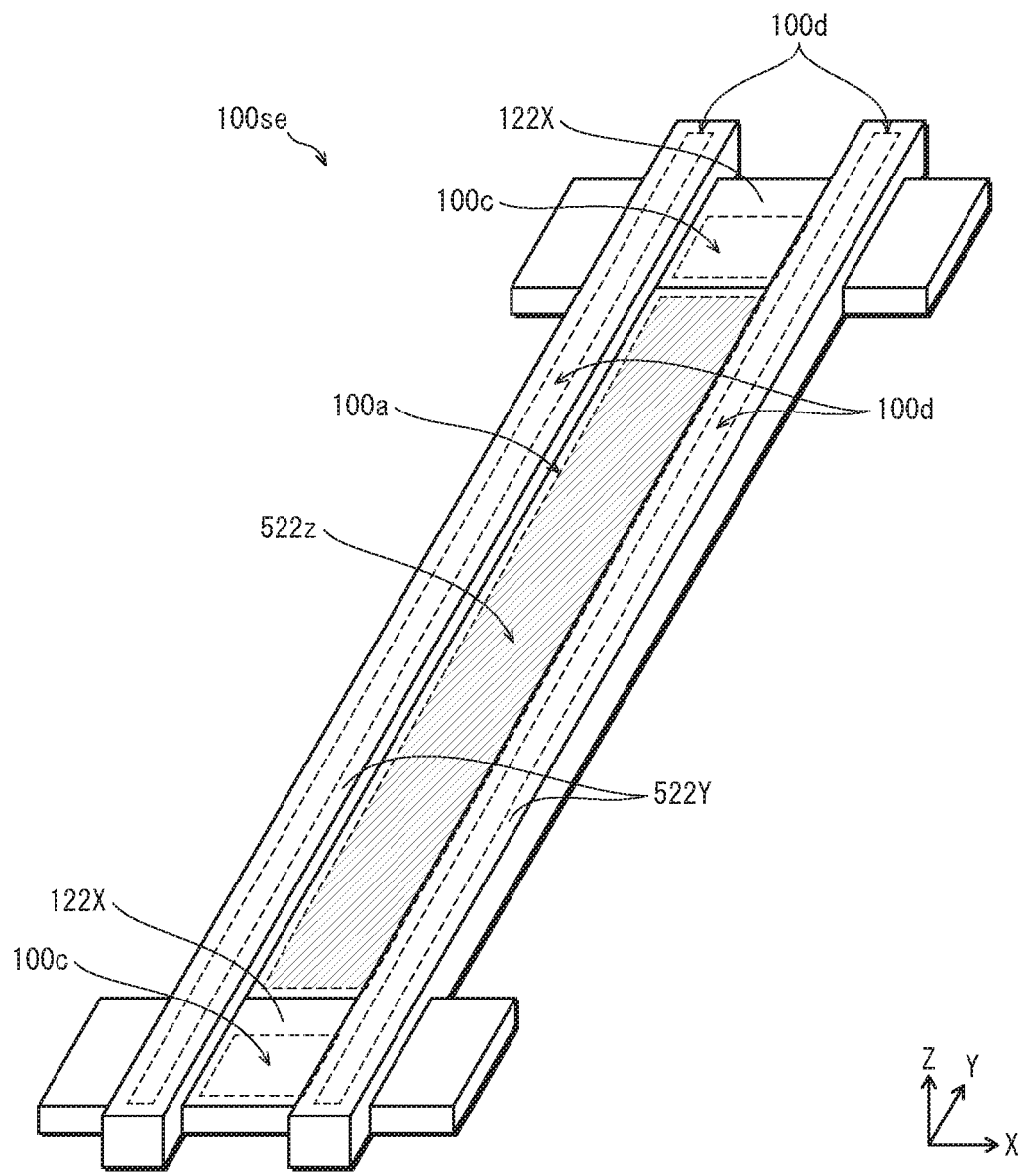
FIG. 5 is a perspective view from an oblique angle above a portion of an insulating layer 122 corresponding to a subpixel 100se of an organic EL display element 100.

FIG. 3 is a schematic plan view showing a portion of the display panel 10 relating to the present embodiment. FIG. 4 is an enlarged plan view of a portion X0 in FIG. 3. FIG. 5 is a perspective view from an oblique angle above a portion of an insulating layer 122 corresponding to the subpixel 100se of the organic EL display element 100.

The display panel 10 is an organic EL display panel that makes use of electroluminescence of organic compound. In the display panel 10, the organic EL display elements 100 each constituting a pixel are arranged in a matrix on a substrate 100x (TFT substrate) on which thin film transistors (TFTs) are formed. The display panel 10 is of the top-emission type and emits light from an upper surface thereof. Here, the X-direction, the Y-direction, and the Z-direction in FIG. 3 are referred to as the row direction, the column direction, and the thickness direction in the display panel 10, respectively in the present specification.

The display panel 10 has, in each unit pixel 100e corresponding to the organic EL display element 100, three types of self-luminous regions 100a where light is emitted by organic compound, namely, self-luminous regions 100aR, 100aG, and 100aB that emit red light, green light, and blue light, respectively (hereinafter, referred to collectively as self-luminous regions 100a when no distinction is made therebetween). In other words, the unit pixel 100e in color display is composed of one set of three subpixels 100se corresponding to the self-luminous regions 100aR, 100aG, and 100aB that are arranged in the row direction as shown in FIG. 4.

As shown in FIG. 3, the display panel 10 includes a plurality of pixel electrode layers 119 that are arranged on the substrate 100x in a matrix with a row interval δX therebetween and a column interval δY therebetween. Also, the display panel 10 includes an insulating layer 122 so as to cover the pixel electrode layers 119.

The pixel electrode layers 119 are rectangular in plan view, and are made of a light-reflective material. The pixel electrode layers 119, which are arranged in a matrix, correspond to the three self-luminous regions 100aR, 100aG, and 100aB, which are arranged in the row direction in the stated order.

The display panel 10 includes the insulating layer 122 having a so-called line shape. A plurality of column insulating sublayers 522Y extending in the column direction (the Y-direction in FIG. 3) are each arranged in the row direction above row outer edges 119a3 and 119a4 of two pixel electrode layers 119 that are adjacent in the row direction and above a region between the row outer edges 119a3 and 119a4 on the substrate 100x. In other words, the column insulating sublayers 522Y are each formed above the row outer edges 119a3 and 119a4 of two pixel electrode layers 119 that are adjacent in the row direction. Accordingly, row outer edges of the self-luminous regions 100a are defined by the row outer edges of the column insulating sublayers 522Y.

On the other hand, the row insulating sublayers 122X extending in the row direction (the X-direction in FIG. 3) are each arranged in the column direction above column outer edges 119a1 and 119a2 of two pixel electrode layers 119 that are adjacent in the column direction and above a region between the column outer edges 119a1 and 119a2 on the substrate 100x. In regions where the row insulating sublayers 122X are formed, organic electroluminescence does not occur in the light-emitting layers 123 above the pixel electrode layers 119, and accordingly these regions are non-self-luminous regions 100b. Accordingly, the column outer edges of the self-luminous regions 100a are defined by the column outer edges of the row insulating sublayers 122X.

A gap 522z exists between each two adjacent column insulating sublayers 522Y. The gaps 522z include red gaps 522zR, green gaps 522zG, and blue gaps 522zB that correspond to the self-luminous regions 100aR, 100aG, and 100aB, respectively (hereinafter, referred to collectively as gaps 522z when no distinction is made therebetween). The display panel 10 includes a large number of column insulating sublayers 522Y and gaps 522z that are alternately arranged.

As shown in FIG. 3 and FIG. 4, the display panel 10 includes the self-luminous regions 100a and the non-self-luminous regions 100b that are alternately arranged along the gaps 522z in the column direction. In each non-self-luminous region 100b, a connection concave part 119c (contact hole) connects the pixel electrode layer 119 and the source $S_1$ of the TFT, and a contact region 119b (contact window) is provided on the pixel electrode layer 119 for electrically connecting to the pixel electrode layer 119.

Also, as shown in FIG. 4, the non-self-luminous region 100b that is covered with the row insulating sublayer 122X has an inter-pixel-electrode-region 100c (hereinafter, referred to just as inter-region 100c) that corresponds to the column interval δY between each two adjacent pixel electrode layers 119.

Similarly, the non-self-luminous region 100b has an inter-pixel-electrode-region 100d (hereinafter, referred to just as inter-region 100d) that corresponds to the row interval δX between each two adjacent pixel electrode layers 119.

As shown in FIG. 5, in one subpixel 100se, the column insulating sublayer 522Y, which is provided in the column direction, is perpendicular to the row insulating sublayer 122X, which is provided in the row direction. The self-luminous region 100a is positioned between two row insulating sublayers 122X that are adjacent in the column direction. The inter-region 100c overlaps the row insulating sublayer 122X in plan view, and the inter-region 100d overlaps the column insulating sublayer 522Y in plan view.

4. Configuration of Components of Display Panel 10

Figure 6:
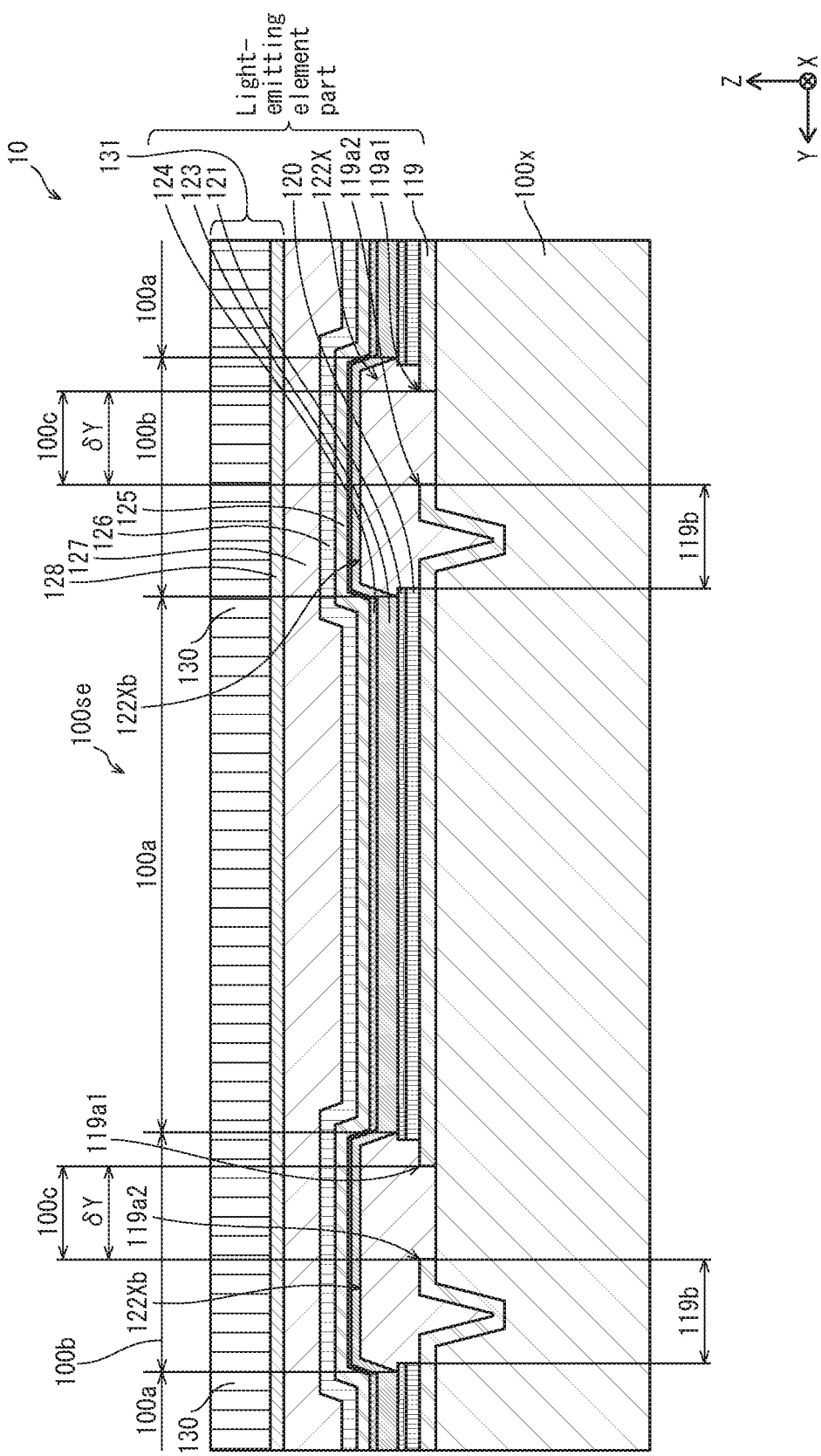
FIG. 6 is a schematic cross-sectional view taken along a line A-A in FIG. 3.

The following describes the configuration of the organic EL display elements 100 of the display panel 10 with reference to the schematic cross-sections shown in FIG. 6 and FIG. 7. FIG. 6 is a schematic cross-sectional view taken along a line A-A in FIG. 3. FIG. 7 is a schematic cross-sectional view taken along a line B-B in FIG. 3.

The display panel 10 relating to the present embodiment includes the substrate 100x (TFT substrate) on which the TFTs are formed in a lower part in the Z-axis direction and the organic EL element units are formed thereon.

4.1 Substrate 100x (TFT Substrate)

The substrate 100x is a supporting member for the display panel 10, and includes a base material (not shown), a TFT layer (not shown) that is formed on the base material, and an interlayer insulating layer (not shown) that is formed above the base material and on the TFT layer.

The base material is a supporting member for the display panel 10, and is a flat plate. The base material is an electrically insulating material such as a glass material, a resin material, a semiconductor material, and a metal material coated with an insulating layer.

The TFT layer is made of the TFTs which are formed on an upper surface of the base material and wirings. In response to drive signals from an external circuit of the display panel 10, the TFTs each electrically connect the pixel electrode layer 119 corresponding thereto with an external power source. The TFTs have a multi-layer structure including an electrode layer, a semiconductor layer, an insulating layer, and so on. The wirings electrically connect between the TFTs, the pixel electrode layers 119, the external power source, the external circuit, and so on.

The interlayer insulating layer is positioned on the upper surface of the substrate 100x, and planarizes at least the subpixels 100se on the upper surface of the substrate 100x that is uneven due to the TFT layer. Also, the interlayer insulating layer fills between the wirings and the TFTs for electrical insulation therebetween.

4.2 Organic EL Element Unit (1) Pixel Electrode Layers 119

The pixel electrode layers 119 are provided in units of subpixels 100se on the interlayer insulating layer, which is positioned on the upper surface of the substrate 100x. The pixel electrode layers 119 are provided for supplying carries to the light-emitting layers 123. When functioning as anodes for example, the pixel electrode layers 119 supply holes to the light-emitting layers 123. Also, since the display panel 10 is of the top-emission type, the pixel electrode layers 119 are light-reflective. The pixel electrode layers 119 are rectangular and plate-like. The pixel electrode layers 119 are arranged on the substrate 100x with the row intervals δX thererebetween, and with the column intervals δY therebetween in the gaps 522z. Furthermore, the connection concave part 119c of each pixel electrode layer 119, which is partially concave in the direction of the substrate 100x, is connected with the source $S_1$ of the TFT through a contact hole that is provided in the upper surface of the substrate 100x.

(2) Hole Injection Layer 120 and Hole Transport Layer 121

Hole injection layers 120 and hole transport layers 121 are layered on the pixel electrode layers 119 in the stated order such that the hole injection layers 120 and the hole transport layers 121 are in contact with each other. The hole injection layers 120 and the hole transport layers 121 have a function of transporting holes injected from the pixel electrode layers 119 to the light-emitting layers 123.

(3) Insulating Layer 122

The insulating layer 122 is made of an insulating material, and covers respective end edges of the pixel electrode layers 119, the hole injection layers 120, and the hole transport layers 121. The insulating layer 122 includes the column insulating sublayers 522Y, which extend in the column direction and are arranged in the row direction, and the row insulating sublayers 122X, which extend in the row direction and are arranged in the column direction. As shown in FIG. 5, a lattice shape is formed by the column insulating sublayers 522Y and the row insulating sublayers 122X (hereinafter, referred to collectively as insulating layer 122 when no distinction is made therebetween).

Specifically, the column insulating sublayers 522Y are each provided above the row outer edges 119a3 and 119a4 of two adjacent pixel electrode layers 119 so as to partially overlap the pixel electrode layers 119. A region where each column insulating sublayer 522Y is formed has a greater width WX in the row direction by a predetermined value than the interval δX between the row outer edges 119a3 and 119a4 of the pixel electrode layers 119.

Also, the row insulating sublayers 122X are each provided above the column outer edges 119a1 and 119a2 of two adjacent pixel electrode layers 119 so as to partially overlap the part 119b of the pixel electrode layer 119. The non-self-luminescent region 100b where the row insulating sublayer 122X is formed has a greater length in the column direction 122X by a predetermined value than the interval δY between the column outer edges 119a1 and 119a2 of the pixel electrode layers 119.

The row insulating sublayers 122X are linear, extend in the row direction, and have a forward tapered cross section parallel to the column direction. The row insulating sublayers 122X are provided in the row direction which is perpendicular to the column direction so as to penetrate the column insulating sublayers 522Y. The row insulating sublayers 122X have upper surfaces 122Xb that are lower in position than upper surfaces 522Yb of the column insulating sublayers 522Y. Accordingly, the column insulating sublayer 122X and the row insulating sublayer 522Y form an opening corresponding to the self-luminous region 100a.

The column insulating sublayers 522Y define the row outer edges of the light-emitting layers 123 that are formed by stemming the flow in the column direction of an ink containing organic compound as the material of the light-emitting layers 123. As described above, the column insulating sublayers 522Y define the column outer edges of the self-luminous region in each pixel. Accordingly, the column insulating sublayers 522Y need to have liquid repellency of a predetermined value or high against ink. Relationship between the material of the column insulating sublayers 522Y and liquid repellency against ink will be described later. The row insulating sublayers 122X are provided in order to control the flow in the column direction of the ink containing organic compound as the material of the light-emitting layers 123. Accordingly, the row insulating sublayers 122X need to have liquid philicity of a predetermined value or more toward ink. Relationship between the material of the row insulating sublayers 122X and liquid philicity toward ink will be described later.

The insulating layer 122 needs to have insulating properties with a volume resistivity of $1\times10^6$ Ωcm or more, in order to prevent electricity leakage in the thickness direction (the Z-direction) between the counter electrode layer 125 and the outer edges 119a1, 119a2, 119a3, and 119a4 of the pixel electrode layers 119 (hereinafter, referred to collectively as outer edges 119a when no distinction is made therebetween). For this reason, the insulating layer 122 is made of a predetermined insulating material as described later. Relationship between black pigment and resin material which are available for the insulating layer 122 and insulating properties will be described later.

Also, the insulating layer 122 is provided in order to suppress reflection of external light toward the inside of the display panel 10 thereby to improve the contrast of the display panel 10. Reflection of external light is phenomenon caused by light that enters the display panel 10 from above the upper substrate 130, is reflected at the pixel electrode layers 119, and is emitted from the upper substrate 130. The contrast decreases especially due to reflection of external light at the outer edges 119a of the pixel electrode layers 119.

In order to suppress reflection of external light, an optical density (OD value) of the insulating layer 122 in the direction of the substrate when viewed in plan is 0.5 to 1.5, more preferably 0.6 to 1.2, and further preferably 0.7 to 1.0. The optical density measured by a spectroscopic reflectance densitometer manufactured by Ellipso). With this configuration, since the insulating layer 122 covers the outer edges 119a of the pixel electrode layers 119, it is possible to suppress entering of external light to the outer edges 119a and also suppress upward emission of light reflected at the outer edges 119a. Relationship between black pigment and resin material, which are available for the insulating layer 122, the thickness of the insulating layer 122, and the optical density will be described later.

In the display panel 10, the column interval δY is shorter in length than the pixel electrode layer 119 in the column direction by a predetermined value. Accordingly, as shown in FIG. 3-FIG. 5, the inter-region 100c, which corresponds to the column interval δY between each two adjacent pixel electrode layers 119 in the non-self-luminous regions 100b, is also shorter in length than the pixel electrode layer 119 in the column direction by the predetermined value. Further, the inter-region 100c has an area that is smaller than the area of the self-luminous region 100a.

(4) Light-emitting Layers 123

The display panel 10 includes a large number of column insulating sublayers 522Y and gaps 522z that are alternately arranged. The light-emitting layers 123 extend in the column direction in the gaps 522z that are defined by the column insulating sublayers 522Y. The light-emitting layer 123 emitting light of a corresponding color is formed in each of red gaps 522zR, green gaps 522zG, and blue gaps 522zB that correspond to the self-luminous regions 100aR, 100aG, and 100aB, respectively.

The light-emitting layers 123 are made of organic compound, and have a function of emitting light through recombination of holes and electrons thereinside. The light-emitting layers 123 are linearly provided in the gaps 522z so as to extend in the column direction.

Light is emitted from only part of the light-emitting layers 123 to which carriers are supplied from the pixel electrode layers 119, and accordingly no electroluminescence of organic compound occurs in ranges of the light-emitting layers 123 where the column insulating sublayer 122X, which is made of an insulating material, exists therebetween. Thus, light is emitted from only parts of the light-emitting layers 123 where no row insulating sublayer 122X exists. These parts are the self-luminous regions 100a. The column outer edges of each self-luminous region 100a are defined by the column outer edges of two adjacent row insulating sublayers 122X.

In the light-emitting layers 123, light is not emitted from side surfaces of the row insulating sublayers 122X and parts 119b that are positioned above the upper surfaces 122Xb. The parts 119b are the non-self-luminous regions 100b. In other words, the non-self-luminous regions 100b correspond to the row insulating sublayers 122X that are projected in plan view. The light-emitting layers 123 in the self-luminous regions 100a are positioned on upper surfaces of the hole transport layer 121. The light-emitting layers 123 in the non-self-luminous regions 100b are positioned on the upper surfaces and the side surfaces of the row insulating sublayers 122X.

As shown in FIG. 4, the light-emitting layers 123 do not exist only in the self-luminous regions 100a but continuously extend to the adjacent non-self-luminous regions 100b. With this configuration, an ink applied to the self-luminous regions 100a can flow in the column direction through an ink applied to the non-self-luminous regions 100b during formation of the light-emitting layers 123. This equalizes the thickness of the light-emitting layers 123 between pixels in the column direction. Note that since the ink flow in the non-self-luminous regions 100b is appropriately suppressed by the row insulating sublayers 122X, a great irregular thickness in the column direction is not likely to occur, and thus an irregular luminance between pixels is improved.

(5) Electron Transport Layer 124

Above the electron transport layer 124 is formed on the insulating layer 122 and on the light-emitting layers 123 in openings defined by the insulating layer 122. In this example, the electron transport layer 124 is also provided on the upper surfaces 522Yb of the column insulating sublayers 522Y that are exposed from the light-emitting layers 123. The electron transport layer 124 has a function of transporting electrons injected from the counter electrode layer 125 to the light-emitting layers 123.

(6) Counter Electrode Layer 125

The counter electrode layer 125 is formed so as to cover the electron transport layer 124. The counter electrode layer 125 is continuous over the entire display panel 10, and may be connected to a bus-bar wiring per pixel or per several pixels (not shown). The counter electrode layer 125 and the pixel electrode layers 119 in pairs sandwich the light-emitting layers 123 therebetween to form an energizing path to supply carries to the light-emitting layers 123. When functioning as a cathode for example, the counter electrode layer 125 supplies electrons to the light-emitting layers 123. The counter electrode layer 125 is formed along a surface of the electron transport layer 124, and is shared by the entire light-emitting layers 123.

The counter electrode layer 125 is made of a light-transmissive and conductive material because the display panel 10 is of the top-emission type.

(7) Sealing Layer 126

The sealing layer 126 is formed so as to cover the counter electrode layer 125. The sealing layer 126 is provided in order to suppress degradation of the light-emitting layers 123 due to exposure to moisture, air, and so on. The sealing layer 126 is provided for the entire display panel 10 so as to cover an upper surface of the counter electrode layer 125.

(8) Bond Layer 127

A bond layer 127 bonds the sealing layer 126 and a CF substrate 131 that is provided above the sealing layer 126 in the Z-axis direction. Color filter layers 128 are formed on a lower main surface in the Z-axis direction of the upper substrate 130 of the CF substrate 131. The bond layer 127 has a function of bonding a rear panel that is composed of the substrate 100X and the layers ranging from the pixel electrode layers 119 to the sealing layer 126, to the CF substrate 131. The bond layer 127 also has a function of preventing the layers from being exposed to moisture, air, and so on.

(9) Upper Substrate 130

The CF substrate 131, which includes the upper substrate 130 on which the color filter layers 128 are formed, is bonded onto the bond layer 127. The upper substrate 130 is made of a light-transmissive material such as cover glass and a transparent resin film because the display panel 10 is of the top-emission type. Also, providing the upper substrate 130 for example improves the rigidity of the display panel 10, and prevents intrusion of moisture, air, and so on.

(10) Color Filter Layers 128

The color filter layers 128 are formed on the upper substrate 130 so as to correspond in position and color to the self-luminous regions 100a. The color filter layers 128 are transparent layers that are provided for transmitting visible light of wavelength corresponding to the R, G, and B colors, and have a function of transmitting light emitted from the R, G, and B pixels and correcting chromaticity of the light. In this example, the red color filter layers 128R, the green color filter layers 128G, and the blue color filter layers 128B are formed for example above the self-luminous regions 100aR in the gaps 522zR, the self-luminous regions 100aG in the gaps 522zG, and the self-luminous regions 100aB in the gaps 522zB, respectively. The color filter layers 128 are specifically formed for example by applying an ink containing a color filter material and solvent onto the upper substrate 130 that is a cover glass for color filter formation that has provided therein openings in units of pixels in a matrix.

4.3 Materials of Components

The following describes an example of materials of the components shown in FIG. 4 and FIG. 5.

(1) Substrate 100x (TFT Substrate)

A lower substrate of the substrate 100x is for example a glass substrate, a quartz substrate, a silicon substrate, a metal substrate made of molybdenum sulfide, copper, zinc, aluminum, stainless, magnesium, iron, nickel, gold, or silver, a semiconductor substrate made of gallium arsenide base or the like, or a plastic substrate. Also, by using a light-transmissive material, the display panel 10 can be used as a transmissive display panel. Furthermore, either thermoplastic resin or thermosetting resin may be used as a flexible plastic material. For example, an electrically-insulating material may be used such as a resin material. The resin substrate may be made for example of a single layer of any of the following materials or a laminate of any two or more of the following materials including polyolefin such as polyethylene, polypropylene, ethylene-propylene copolymer, and ethylene-vinylacetate copolymer (EVA), cyclic polyolefin, modified polyolefin, polyvinyl chloride, polyvinylidene chloride, polystyrene, polyamide, polyimide (PI), polyamideimide, polycarbonate, poly-(4-methylpentene-1), ionomer, acrylic resin, polymethyl methacrylate, acrylic-styrene copolymer (AS resin), butadiene-styrene copolymer, ethylene vinyl alcohol copolymer (EVOH), polyester such as polyethylene terephthalate (PET), polybutylene terephthalate, polyethylene naphthalate (PEN), and poly cyclohexane terephthalate (PCT), polyether, polyether ketone, polyether sulfone (PES), polyeter imide, polyacetal, polyphenylene oxide, modified polyphenylene oxide, polyarylate, aromatic polyester (liquid crystal polymer), polytetrafluoroethylene, polyvinylidene fluoride, other fluororesin, thermoplastic elastomer such as styrenic elastomer, polyolefin elastomer, polyvinyl chloride elastomer, polyurethane elastomer, fluorine rubber elastomer, and chlorinated polyethylene elastomer, epoxy resin, phenol resin, urea resin, melamine resin, unsaturated polyester resin, silicone resin, polyurethane, or copolymer, blend, polymer alloy or the like mainly including such a material.

Known materials are used for a gate electrode, a gate insulating layer, a channel layer, a channel protection layer, a source electrode, a drain electrode, and so on that constitute each of the TFTs. The gate electrode is made for example of a laminate of copper (Cu) and molybdenum (Mo). The gate insulating layer is made for example of any known electrically-insulating material such as silicon oxide ($SiO_2$) and silicon nitride (SiNx) regardless of whether the material is organic or inorganic. The channel layer is made of oxide semiconductor containing at least one of indium (In), gallium (Ga), and zinc (Zn). The channel protection layer is made for example of silicon oxynitride (SiON), silicon nitride (SiN), or aluminum oxide (AlOx). The source electrode and the drain electrode are made for example of a laminate of copper-manganese (CuMn), copper (Cu), and molybdenum (Mo).

The insulating layer above the TFT is made for example of silicon oxide ($SiO_2$), a combination of silicon nitride (SiN) and silicon oxynitride (SiON), or a combination of silicon oxide (SiO) and silicon oxynitride (SiON). A connection electrode layer of the TFT is made for example of a laminate of copper-manganese (CuMn), copper (Cu), and molybdenum (Mo). Note that the material of the connection electrode layer is not limited to this, and may be appropriately selected from conductive materials.

The interlayer insulating layer on the upper surface of the substrate 100x is made of an organic compound such as polyimide, polyamide, acrylic resin, siloxane resin, and phenol resin. The interlayer insulating layer for example has a thickness of 2 μm to 8 μm.

(2) Pixel Electrode Layers 119

The pixel electrode layers 119 are made of a metal material. In the display panel 10 of the top-emission type relating to the present embodiment, an optical cavity structure is adopted by the optimal film thickness settings, thereby adjusting the chromaticity of emission light to increase the luminance. For this reason, the pixel electrode layers 119 need to have a surface part that is highly light-reflective. In the display panel 10 relating to the present embodiment, the pixel electrode layers 119 each may be a laminate containing layers selected from a metal layer, an alloy layer, and a transparent conductive layer. The metal layer is made for example of a metal material including silver (Ag) or aluminum (Al). The alloy layer is made for example of alloy of silver, palladium, and copper (APC), alloy of silver, rubidium, and gold (ARA), alloy of molybdenum and chromium (MoCr), or alloy of nickel and chromium (NiCr). The transparent conductive layer is made for example of indium tin oxide (ITO) or indium zinc oxide (IZO).

(3) Hole Injection Layer 120

The hole injection layer 120 is made for example of oxide of a metal such as silver (Ag), molybdenum (Mo), chromium (Cr), vanadium (V), tungsten (W), nickel (Ni), and iridium (Ir) or a conductive polymer material such as polyethylenedioxythiophene (PEDOT).

In the case where the hole injection layer 120 is made of oxide of transition metal, the hole injection layer 120 has a plurality of energy levels because oxide of transition metal has a plurality of oxidation numbers. This facilitates hole injection, and therefore reduces driving voltage.

(4) Hole Transport Layer 121

The hole transport layer 121 is made for example of a high-molecular compound such as polyfluorene, polyfluorene derivative, polyallylamine, and polyallylamine derivative.

(5) Insulating Layer 122

The insulating layer 122 is mainly made of an insulating organic resin material to which black pigment is added.

The organic material for the insulating layer 122 is for example acrylic resin, polyimide resin, or novolac phenolic resin. The insulating layer 122 should preferably be resistant to organic solution. Also, the insulating layer 122 sometimes undergoes an etching process, a baking process, and so on in the manufacturing process, and accordingly should preferably be made of a highly resistant material in order to avoid excessive distortion and transformation due to such processes.

Also, fluorine processing may be performed on a surface of the insulating layer 122 in order to provide the surface with water repellency. Furthermore, the insulating layer 122 may be made of a material containing fluorine. Moreover, the baking process may be performed by irradiating the insulating layer 122 with ultraviolet at a low temperature in order to lower the water repellency of the insulating layer 122.

The black pigment is for example carbon black pigment, titanium black pigment, other metal oxide pigment, organic pigment, or the like. Molybdenum (Mo), chromium (Cr), or the like may be used for the metal oxide pigment.

Furthermore, the insulating layer 122 may have a multi-layer structure of two or more layers, instead of a single-layer structure. In this case, the above materials may be combined for each layer, or an inorganic material and an organic material may be used for each layer.

(6) Light-emitting Layers 123

The light-emitting layers 123 have a function of emitting light by excitation resulting from injection and recombination of holes and electrons. The light-emitting layers 123 need to be made of a luminous organic material by a wet printing method.

Specifically, the light-emitting layers 123 should preferably be made for example of a fluorescent substance disclosed in Japanese Patent Application Publication No. H05-163488, such as oxinoid compound, perylene compound, coumarin compound, azacoumarin compound, oxazole compound, oxadiazole compound, perinone compound, pyrrolopyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylenepyran compound, dicyanomethylenethiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, and metal complex of 8-hydroxyquinoline compound, metal complex of 2-bipyridine compound, complex of a Schiff base and group III metal, oxine metal complex, and rare earth complex.

(7) Electron Transport Layer 124

The electron transport layer 124 is made for example of oxydiazole derivative (OXD), triazole derivative (TAZ), phenanthroline derivative (BCP Bphen), or the like.

(8) Counter Electrode Layer 125

The counter electrode layer 125 is made of a light-transmissive and conductive material. The counter electrode layer 125 is made for example of indium tin oxide (ITO) or indium zinc oxide (IZO). Alternatively, the counter electrode layer 125 may be a thin electrode film made of silver (Ag), aluminum (Al), or the like.

(9) Sealing Layer 126

The sealing layer 126 has a function of preventing the organic layers such as the light-emitting layers 123 from being exposed to moisture and air. The sealing layer 126 is made for example of a light-transmissive material such as silicon nitride (SiN) and silicon oxynitride (SiON). Also, a resin sealing layer that is made of a resin material such as acrylic resin and silicone resin may be provided on a layer that is made of a material such as silicon nitride (SiN) and silicon oxynitride (SiON).

In the display panel 10 of the top-emission type relating to the present embodiment, the sealing layer 126 needs to be made of a light-transmissive material.

(10) Bond Layer 127

The bond layer 127 is made for example of a resin adhesive. A light-transmissive resin material may be adopted such as acrylic resin, silicone resin, and epoxy resin.

(11) Upper Substrate 130

The upper substrate 130 is for example made of a light-transmissive material such as glass, quartz, and plastic.

(12) Color Filter Layers 128

The color filter layers 128 are made of a known resin material (for example, the color resist manufactured by JSR Corporation) or the like.

5. Manufacturing Method of Display Panel 10

(1) Formation of Pixel Electrode Layers 119

Figure 8A:
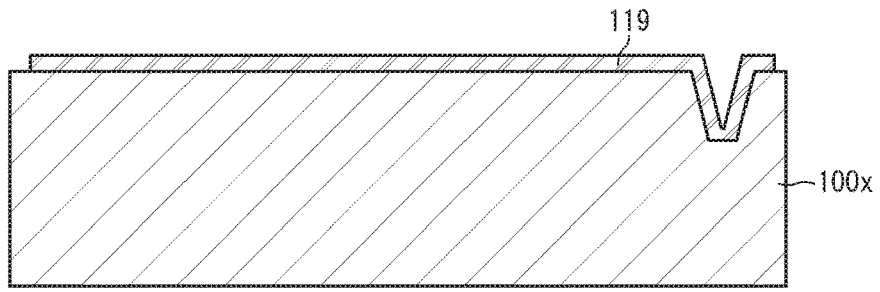
FIG. 8A-FIG. 8D are schematic cross-sectional views showing processes in manufacture of the organic EL display panel 10, taken along a line at the same position as the line A-A in FIG. 3.

As shown in FIG. 8A, the substrate 100x, which includes the base material, the TFT layer, and the interlayer insulating layer, is prepared. Contact holes are provided in the interlayer insulating layer so as to form the pixel electrode layers 119.

The pixel electrode layers 119 are formed by forming a metal film using a sputtering method, a vacuum deposition method, or the like, and then patterning the metal film using a photolithography method and an etching method. Note that the pixel electrode layers 119 are electrically connected with the electrodes of the TFTs.

(2) Formation of Hole Injection Layer 120 and Hole Transport Layer 121

Figure 8B:
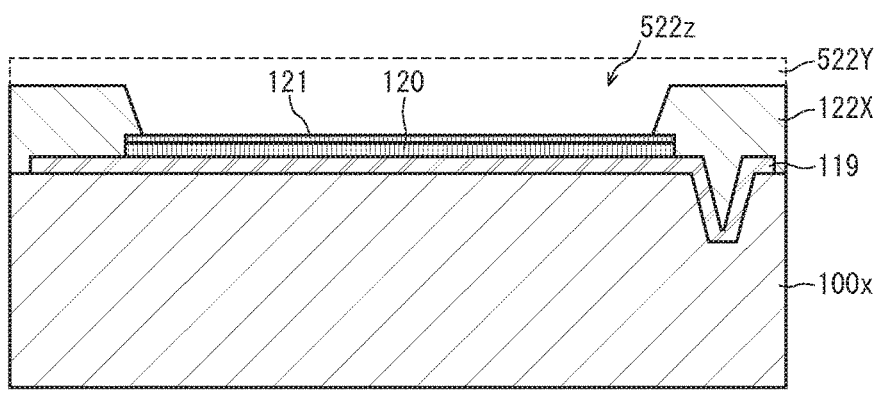

As shown in FIG. 8B, the hole injection layer 120 and the hole transport layer 121 are sequentially formed on the pixel electrode layers 119, and the insulating layer 122 is formed so as to cover the edge parts of the hole transport layer 121.

The hole injection layer 120 and the hole transport layer 121 are each formed by forming a metal oxide film (for example, tungusten oxide film) using the sputtering method, and then patterning the film in units of pixel using the photolithography method and the etching method.

(3) Formation of Insulating Layer 122

As shown in FIG. 8B, the insulating layer 122 is formed so as to cover the edge parts of the hole transport layer 121. In formation of the insulating layer 122, the row insulating sublayers 122X are firstly formed, and then the column insulating sublayers 522Y are formed so as to form the gaps 522z defining the pixels, such that a surface of the hole transport layer 121 is exposed in the gap 522z between each two row insulating sublayers 122X.

The insulating layer 122 is formed by forming a film made of material of the insulating layer 122 (for example, a photosensitive resin material containing black pigment) using a spin coating method or the like, and patterning a resin film sequentially to form the row insulating sublayers 122X and the column insulating sublayers 522Y. The row insulating sublayers 122X and the column insulating sublayers 522Y are formed by performing exposure through a mask disposed above the resin film and then performing development.

Also, in order to arrange the row insulating sublayers 122X or the column insulating sublayers 522Y in striped pattern on the substrate 100x, the insulating layer 122 may be formed by applying a paste of the row insulating sublayers 122X or the column insulating sublayers 522Y in a striped pattern onto the substrate 100x using a die coating method and baking the paste. This avoids the necessity of an ultraviolet irradiation process through a pattern mask or the like, and thereby reducing the manufacturing costs.

In the case where the insulating layer 122 has an upper limit thickness of 10 μm or more, the manufacturing thickness inequality further increases, and control on the bottom line thickness is difficult. Also, the insulating layer 122 should preferably have an upper limit thickness of 7 μm or less in terms of productivity decrease due to tact increase. Furthermore, as the thickness of the insulating layer 122 decreases, the insulating layer 122 needs to have the thickness and the bottom line thickness that are substantially equal to each other. In the case where the insulating layer 122 has a lower limit thickness of 1 μm or less, it is difficult to obtain a desired bottom line thickness due to resolution restriction. In the case of a typical exposure machine for flat display panels, the lower limit is 2. Therefore, the insulating layer 122 should preferably have a thickness of 1 μm to 10 μm, and more preferably 2 μm to 7 μm, for example. In the present embodiment, the insulating layer 122 has a thickness of approximately 5.0 μm.

In the case where a rate of black pigment to be added to a resin material increased thereby to increase optical density (OD value), it is difficult to manufacture the insulating layer 122 in process due to a liquidity decrease of material of the insulating layer 122. In the display panel 10, the insulating layer 122 has an optical density (OD value) of 1.5 or less, and thus the liquidity of the material of the insulating layer 122 falls within an acceptable range in process. As a result, it is possible to form a film having the above-described thickness from the material of the insulating layer 122 using the spin coating method or the like. If the addition rate of black pigment is increased thereby to increase the optical density (OD value) of the insulating layer 122 to 2.0 or more, it is difficult to manufacture the insulating layer 122 in process due to a liquidity decrease of the material of the insulating layer 122.

Moreover, the baking process may be performed by irradiating the insulating layer 122 with ultraviolet at a low temperature in order to lower the water repellency of the insulating layer 122. Also, fluorine processing may be performed on the surface of the insulating layer 122 so as to provide the surface with water repellency.

(4) Formation of Light-emitting Layers 123 and Electron Transport Layer 124

Figure 8C:
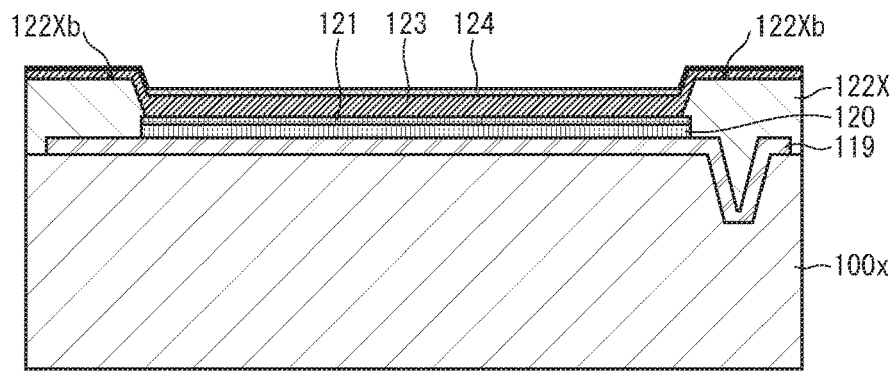

As shown in FIG. 8C, in each of the gaps 522z, which are defined by the row insulating sublayers 122X and the column insulating sublayers 522Y, the light-emitting layer 123 and the electron transport layer 124 are layered in the stated order from the side of the hole transport layer 121.

The light-emitting layers 123 are formed by applying an ink containing material of the light-emitting layers 123 to the inside of the gaps 522z, which are defined by the insulating layers 122, using a printing method, and then baking the ink. The electron transport layer 124 is formed as a solid film in the gaps 522z and on the column insulating sublayers 522Y using the sputtering method or the like.

(5) Formation of Counter Electrode Layer 125 and Sealing Layer 126

Figure 8D:
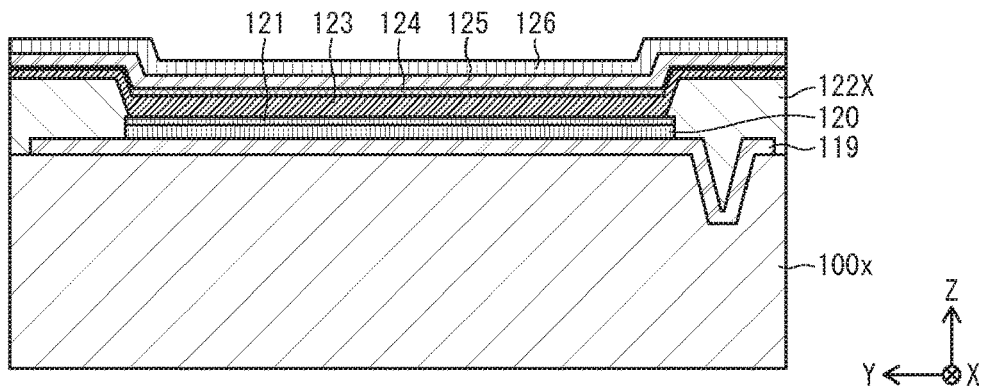

As shown in FIG. 8D, the counter electrode layer 125 and the sealing layer 126 are sequentially layered each as a solid film so as to cover the electron transport layer 124 in the gaps 522z and on the column insulating sublayers 522Y. The counter electrode layer 125 and the sealing layer 126 are formed using a CVD method, the sputtering method, or the like.

(6) Formation of CF Substrate 131

Next, a manufacturing process of the CF substrate 131 is exemplified with reference to FIG. 9A to FIG. 9D.

Figure 9A:
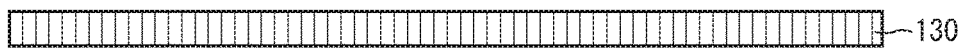
FIG. 9A-FIG. 9D are schematic cross-sectional views showing processes in manufacture of the CF substrate 131 of the organic EL display panel 10.
Figure 9B:
Figure 9C:
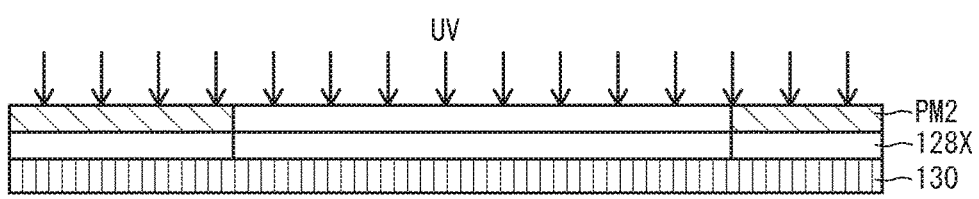
Figure 9D:
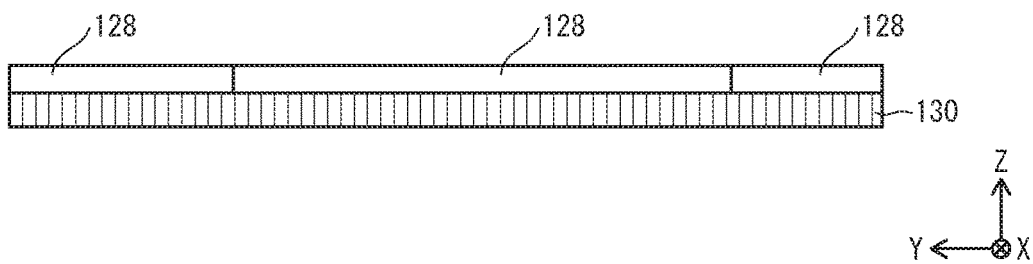

The transparent upper substrate 130 is prepared (FIG. 9A). Next, a paste 128X is formed by dispersing in solvent a material of the color filter layers 128 (the color filter layers 128G, for example) mainly containing ultraviolet curable resin component, and the paste 128X is applied onto the surface of the upper substrate 130 (FIG. 9B). The solvent is removed to a certain degree, and then a predetermined pattern mask PM2 is placed on the paste 128X and ultraviolet irradiation is performed (FIG. 9C). After that, curing is performed. The pattern mask PM2 and part of the paste 128X that has not been cured are removed, and development is performed. As a result, the color filter layers 128G are complete (FIG. 9D). The color filter layers 128R and 128B are also formed by similarly repeating the processes in FIG. 9B and FIG. 9D on color filter materials of corresponding colors. Note that any commercially available color filter products may be used instead of the paste 128X.

This completes the CF substrate 131.

(7) Bonding of CF Substrate 131 and Rear Panel

Next, a material of the bond layer 127 mainly containing a light-transmissive ultraviolet curable resin is applied onto the rear panel, which is composed of the substrate 100X and the layers ranging from the pixel electrode layers 119 to the sealing layer 126 (FIG. 10A). The light-transmissive ultraviolet curable resin is for example acrylic resin, silicone resin, or epoxy resin.

Subsequently, ultraviolet irradiation is performed on the applied material, and the CF substrate 131 and the rear panel are bonded to each other while relative positional relationship therebetween is maintained. At this time, intrusion of gas therebetween needs to be prevented. Then, after the CF substrate 131 and the rear panel are baked and a sealing process is performed, the display panel 10 is complete (FIG. 10B).

6. Effect of Display Panel 10

Figure 11:
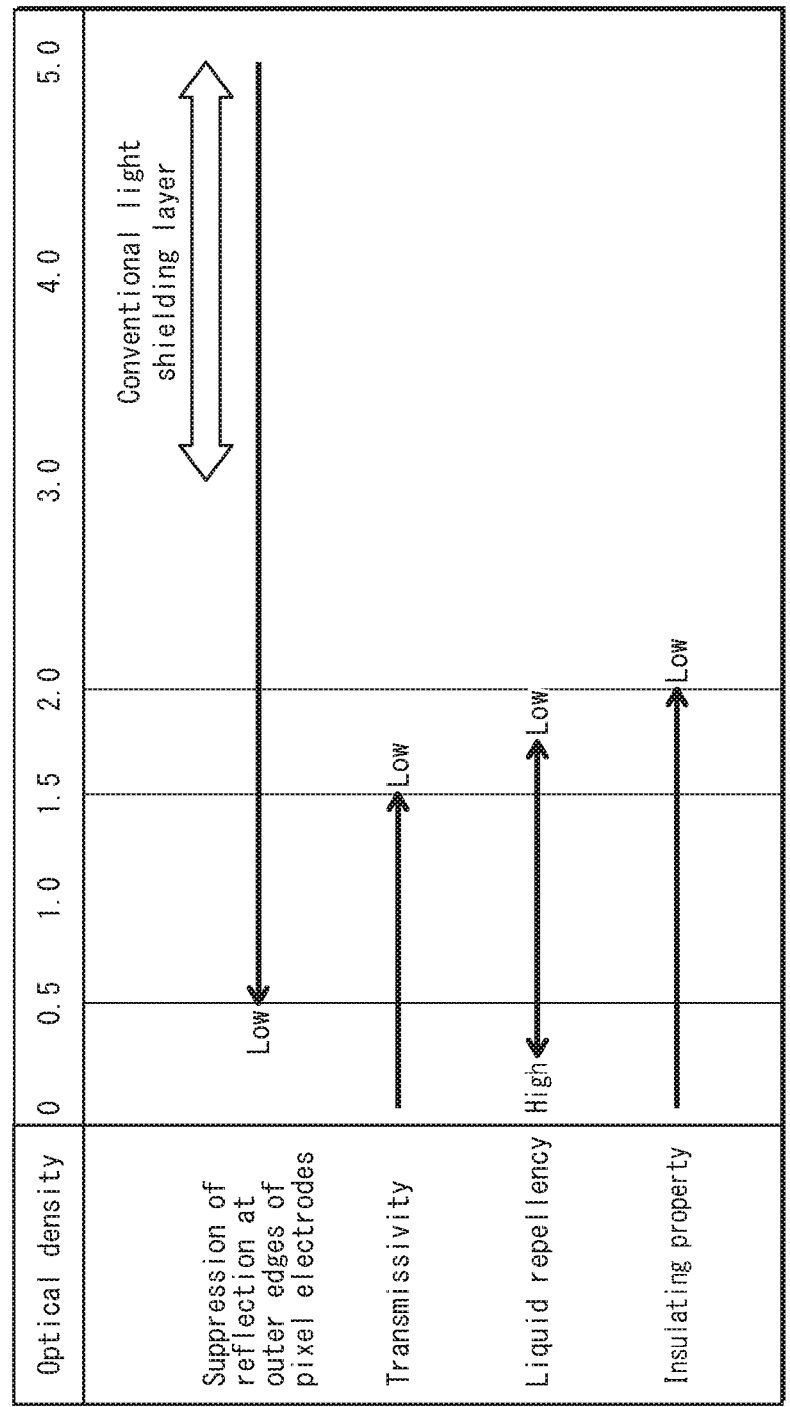
FIG. 11 is for describing functions of the organic EL display device 1.

The following describes an effect of the display panel 10. FIG. 11 is for describing the functions of the display device 1 employing the display panel 10.

6.1 Suppression of Glare on Display Panel Surface Due to External Light Reflection The inventors made various considerations in order to suppress a decrease in display contrast due to reflection of external light at the outer edges of the reflective pixel electrode layers. The following describes the inventors' consideration. The pixel electrode layers 119 are formed through the process such as the sputtering method and the vacuum deposition method. Accordingly, the pixel electrode layers 119 have the upper surfaces whose surface is smooth, and thus refection of external light is comparatively difficult to notice at the upper surfaces of the pixel electrode layers 119 excepting the outer edges 119a thereof. Compared with this, the outer edges 119a of the pixel electrode layers 119 are patterned by etching. Accordingly, edge surfaces of the outer edges 119a are greater in surface roughness than the upper surfaces, and are inclined from the vertical direction so as to have a trapezoidal shape. Thus, when external light enters the outer edges 119a of the pixel electrode layers 119 that are finely patterned in every direction of the display panel surface, light diffuse reflection occurs. When an observer views the light reflected in any direction, he recognizes the light as glare on the display panel surface. This causes deterioration of quality of display images. For example, when external light enters from above the upper substrate 130 in the column direction in plan view, the light is strongly reflected in the column direction at the column outer edges 119a1 and 119a2 of the pixel electrode layers 119. Also, when external light enters from above the upper substrate 130 in the row direction in plan view, the light is strongly reflected in the row direction at the row outer edges 119a3 and 119a4 of the pixel electrode layers 119.

As a method of suppressing reflection of external light at an outer edge of a reflective pixel electrode layer in an organic EL display panel, Japanese Patent Application Publication No. 2002-208475 discloses an organic EL device including a reflective electrode that is formed on a substrate, a black insulating layer from which the reflective electrode is partially exposed, a light-emitting layer that is formed on the reflective electrode, and a counter electrode that is formed on the light-emitting layer. The black insulating layer has an optical density of 2 or more, preferably 3 or more, and has a volume resistivity of $5 \times 10^6$ Ωcm or more. Also, according to the above document, the black insulating layer with this configuration achieves both insulating properties and light absorbing properties, and blurring, mixture, and reflection of light are suppressed, and thereby realizing a device with excellent visibility and contrast.

Compared with this, the inventors' considerations found out that by disposing the insulating layer 122 having an optical density (OD value) of 0.5 to 1.5 above the outer edges 119a of the pixel electrode layers 119, it is possible to prevent external light from entering the outer edges 119a of the pixel electrode layers 119 and block emission of light reflected at the outer edges 119a. Specifically, in the display panel 10, since the column insulating sublayers 522Y are disposed so as to overlap the row outer edges 119a3 and 119a4 of the pixel electrode layers 119, it is possible to suppress strong reflection of external light, which enters from above the upper substrate 130 in the row direction, at the row outer edges 119a3 and 119a4 of the pixel electrode layers 119 in the row direction. Also, since the row insulating sublayers 122X are disposed so as to overlap the column outer edges 119a1 and 119a2 of the pixel electrode layers 119, it is possible to suppress strong reflection of external light, which enters from above the upper substrate 130 in the column correction, at the column outer edges 119a1 and 119a2 of the pixel electrode layers 119 in the row direction. In this way, it is possible to effectively suppress reflection of external light at the outer edges 119a of the pixel electrode layers 119 where external light reflection is the most prominent in the display panel 10.

Furthermore, the insulating layer 122 may have an optical density (OD value) of 0.5 to 1.5, and the row insulating sublayers 122X may have a higher optical density (OD value) than the column insulating sublayers 522Y. With this configuration, it is possible to further effectively suppress a problem that light entering from above the upper substrate 130 in the column direction is strongly reflected at the column outer edges 119a1 and 119a2 of the reflective pixel electrode layers 119 in the row direction. This problem is further prominent in a typical installation condition of the display panel 10.

Furthermore, in the display panel 10, it is not necessary to perform positional adjustment with a high precision for bonding the pixels of the rear panel and the light shielding layer of the CF substrate 131 to each other while relative positional relationship therebetween is maintained. Especially in the configuration in which the color filter layer 128 of a different color for each pixel is not provided on the CF substrate 131, positioning between the rear panel and the CF substrate 131 can be omitted. Moreover, even in the case where the display panel 10 does not include the CF substrate 131, for example in the case where the display panel 10 is a transparent display, it is possible to suppress reflection of external light and improve the luminous efficiency.

6.2 Liquid Repellency

The insulating layer 122 is made of a resin material to which black pigment is added. The black pigment is for example carbon black pigment, titanium black pigment, other metal oxide pigment of molybdenum (Mo), and chromium (Cr), or the like, or organic pigment. The inventors' considerations found out that in the case where a ratio of black pigment to be added to a resin material is increased in order to increase the optical density (OD value), liquid philicity to an ink containing an organic compound increases, and liquid repellency against the ink decreases. By setting the insulating layer 122 to have an optical density (OD value) of 0.5 to 1.5, liquid philicity and liquid repellency to and against the ink containing the organic compound, which is the material of the light-emitting layers 123, fall within an acceptable range in process.

Also, as described above, the column insulating sublayers 522Y need to have liquid repellency of a predetermined value or more against an ink containing organic compound as the material of the light-emitting layers 123, in order to define the row outer edges of the light-emitting layers 123 by stemming flow in the column direction of the ink containing organic compound as the material of the light-emitting layers 123. On the other hand, in order to control the flow in the column direction of the ink as the material of the light-emitting layers 123, the row insulating sublayers 122X need to have liquid philicity of a predetermined value or more to the ink. The column insulating sublayers 522Y may have higher liquid repellency against the ink than the row insulating sublayers 122X by increasing the addition ratio of black pigment to resin in the column insulating sublayers 522Y than in the insulating layer 122X. Thus, it is preferable that the row insulating sublayers 122X have a higher optical density (OD value) than the column insulating sublayers 522Y, such that liquid repellency (liquid philicity) of both the column insulating sublayers 522Y and the row insulating sublayers 122X against and to the ink fall within an acceptable range in process.

Alternatively, the surfaces of the column insulating sublayers 522Y may undergone fluorine processing so as to have water repellency. Further alternatively, the column insulating sublayers 522Y may be made of a material containing fluorine. The surfaces of both the column insulating sublayers 522Y and the column the insulating sublayer 122X may undergone fluorine processing, or both the column insulating sublayers 522Y and the column the insulating sublayer 122X may be made of a material containing fluorine. Furthermore, the degree in processing or a contained amount of fluorine may differ between the column insulating sublayers 522Y and the column the insulating sublayer 122X. Yet alternatively, in order to lower the water repellency of the surface of the insulating layer 122, the baking process may be performed by irradiating the insulating layer 122 with ultraviolet at a low temperature.

6.3 Insulating Properties

As described above, the insulating layer 122 needs to have insulating properties with a volume resistivity of $1 \times 10^6$ Ωcm or more, in order to prevent electricity leakage in the thickness direction (the Z-direction) between the outer edges 119a of the pixel electrode layers 119 and the counter electrode layer 125. The insulating layer 122 is made of a resin material to which black pigment is added such as carbon black pigment, titanium black pigment, and metal oxide pigment of for example molybdenum (Mo) or chromium (Cr). The inventors' considerations found out that when the ratio of the black pigment to be added to the resin material is increased in order to increase the optical density (OD value), the insulating properties of the insulating layer 122 decreases. In view of this, the optical density (OD value) of the insulating layer 122 is decreased to 1.5 or less, and as a result the insulating layer 122 can have insulating properties with a volume resistivity of $1 \times 10^6$ Ωcm or more. If the insulating layer 122 has an optical density (OD value) of 2.0 or more, the insulating layer 122 has a volume resistivity of less than $1 \times 10^6$ Ωcm, and cannot have insulating properties enough to prevent electricity leakage caused by the outer edges 119a of the pixel electrode layers 119.

6.4 Transmissivity

In the display panel 10, the inter-regions 100c, which correspond to the column intervals δY between each two adjacent pixel electrode layers 119, have an area that is 10% to 30% of the area of the self-luminous regions 100a. Accordingly, owing to the insulating layer 122 having an optical density (OD value) of 0.5 to 1.5 in the display panel 10, in the case where the substrate 100x, which is made of a light-transmissive material, is used, it is possible to cause light entering from the rear surface of the substrate 100x to transmit through the inter-regions 100c and 100d, and thereby to emit upward. Thus, the display panel 10 can be used as a transmissive display panel. If the insulating layer 122 has an optical density (OD value) of 2.0 or more, it is impossible to cause light incident from the rear surface of the substrate 100x to emit upward though the substrate 100x is made of a light-transmissive material. Thus, the display panel 10 in this case cannot be used as a transmissive display panel.

FIG. 12A-FIG. 12C are schematic diagrams for describing functions of the display device 1 when the display panel 10 is used as a transmissive display panel.

Assume a case where the display panel 10 is used as a transmissive display panel. As shown in FIG. 12A, in the case where a scenery X exists on the side of the rear surface of the display device 1 relative to an observer OP, the observer OP can simultaneously view transmitting light b1, b2, and b3 and light a1, a2, a3, and a4. The transmitting light b1, b2, and b3 enters from the rear surface of the display device 1, transmits through the inter-regions 100c and 100d, and is emitted upward above the display device 1. The light a1, a2, a3 is emitted from the self-luminous regions 100a of the display device 1. This configuration makes it possible to utilize the display device 1 for windows and the like of sightseeing vehicles thereby to display sightseeing information and the like on the display device 1.

Alternatively, as shown in FIG. 12B, light emission from the display device 1 may be suspended under predetermined conditions. In the case where a target Y exists on the side of the rear surface of the display device 1 relative to an observer OP, the observer OP can gaze only transmitting light c1, c2, c3, and c4 that enters from the rear surface of the display device 1, transmits through the inter-regions 100c and 100d, and is emitted upward above the display device 1. This configuration makes it possible to utilize the display device 1 for windows for driving and the like of vehicles.

Further alternatively, as shown in FIG. 12C, information may be displayed on the peripheral part of the display device 1 while suspending light emission from the central part of the display device 1. An observer OP can selectively view transmitting light c1, c2, c3, and c4, light d1, d2, d3, and d4. The transmitting light c1, c2, c3, and c4 enters from the rear surface of the display device 1, transmits through the inter-regions 100c and 100d, and is emitted upward above the display device 1. The light d1, d2, d3, and d4 is emitted from the self-luminous regions 100a, which are positioned on the peripheral part of the display device 1. This configuration makes it possible to utilize the display device 1 for windows for driving and the like of vehicles thereby to display running information and the like on the display device 1.

5. Summary

As described above, the display panel 10 relating to Embodiment 1 includes a plurality of subpixels 100se arranged in a matrix, the display panel 10 comprising: a substrate 100x; a plurality of pixel electrode layers 119 that are made of a light-reflective material and are arranged on the substrate 100x in a matrix; an insulating layer 122 that is provided at least above row and column outer edges 119a of the pixel electrode layers 119 and above inter-regions 100c and 100d on the substrate 100x between the row and column outer edges 119a; an organic functional layer 120, 121, 123, and 124 that is provided above the pixel electrode layers 119; and a counter electrode layer that is made of a light-transmissive material and is provided above the organic functional layer 120, 121, 123, and 124, wherein the organic functional layer 120, 121, 123, and 124 includes a plurality of light-emitting layers 123 that are provided in regions above the pixel electrode layers 119 where the insulating layer 122 is not provided, the light-emitting layers 123 causing organic electroluminescence, and the insulating layer 122 has an optical density of 0.5 to 1.5 in a direction of the substrate 100x when viewed in plan.

With this configuration, it is possible to suppress a decrease in display contrast due to reflection of external light at the outer edges 119a of the pixel electrode layers 119.

Also, in the display panel 10, the insulating layer 122 may include: a plurality of column insulating sublayers 522Y that are provided at least above the row outer edges 119a3 and 119a4 of the pixel electrode layers 119 and above the inter-regions 100c and 100d on the substrate 100x between the row outer edges 119a3 and 119a4; and a plurality of row insulating sublayers 122x that are provided at least above the column outer edges 119a1 and 119a2 of the pixel electrode layers 119 and above the inter-regions 100c and 100d on the substrate 100x between the column outer edges 119a1 and 119a2, and the light-emitting layers 123 may be each provided in a gap 522z between two adjacent of the column insulating sublayers 522Y.

With this configuration, in a display panel including an insulating layer having a so-called line shape, it is possible to suppress a decrease in display contrast due to reflection of external light at the outer edges 119a of the pixel electrode layers 119.

<Embodiment 2>

In the display panel 10 relating to Embodiment 1, the insulating layer 122 has a so-called line shape. Specifically, the column insulating sublayers 522Y are each formed above the outer edges in the row direction of two pixel electrode layers 119 that are adjacent in the row direction. The row insulating sublayers 122X extending in the row direction are each arranged in the column direction above the outer edges of two pixel electrode layers 119 that are adjacent in the column direction and above a region between the outer edges. The column insulating sublayers 522Y and the row insulating sublayers 122X are perpendicular to each other to constitute the insulating layer 122 having a lattice shape.

However, the insulating layer 122 only needs to be formed above the row and column outer edges of the pixel electrode layers 119, and the shape of the insulating layer 122 may be appropriately modified.

In an organic EL display panel 10A relating to Embodiment 2, a plurality of pixel electrode layers 119 are arranged in a matrix on a substrate 100Ax, an insulating layer 122A is formed so as to cover the pixel electrode layers 119, and openings 122Az are provided for self-luminous regions 100Aa in the inside of the outer edges of the pixel electrode layers 119. The insulating layer 122A has a so-called lattice shape. This point is a difference from Embodiment 1.

The following describes the display panel 10A.

1. Configuration of Display Panel 10A

The display panel 10A differs from that in Embodiment 1 in terms of configuration of the insulating layer 122A and the layering order of a hole transport layer 121A and row insulating sublayers 122AX. Accordingly, description is given on these configurations. Configuration other than the above is the same as the display panel 10, and accordingly the same reference numbers are appended and description thereof is omitted.

Figure 13:
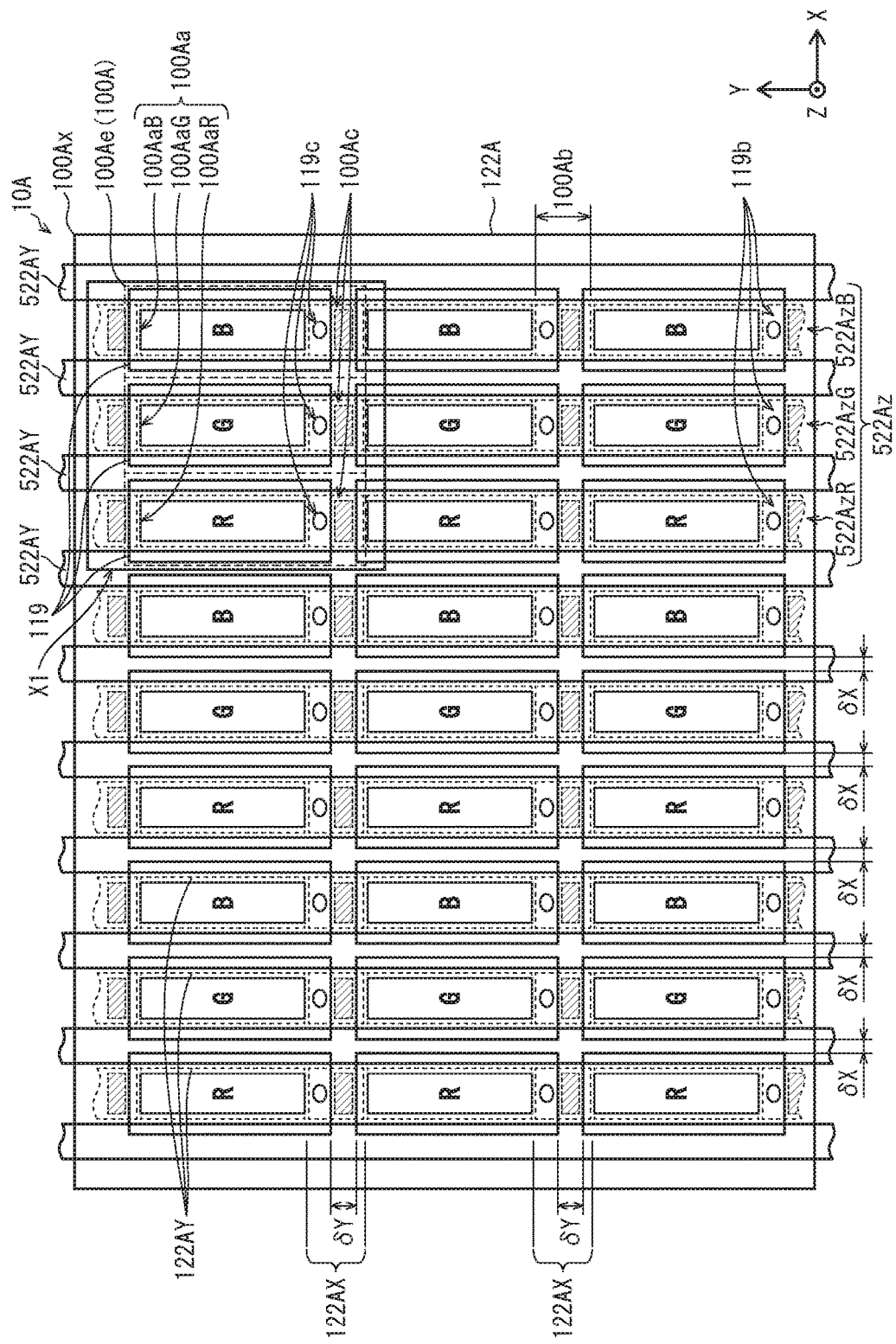
FIG. 13 is a schematic plan view showing a portion of an organic EL display panel 10A.
Figure 14B:
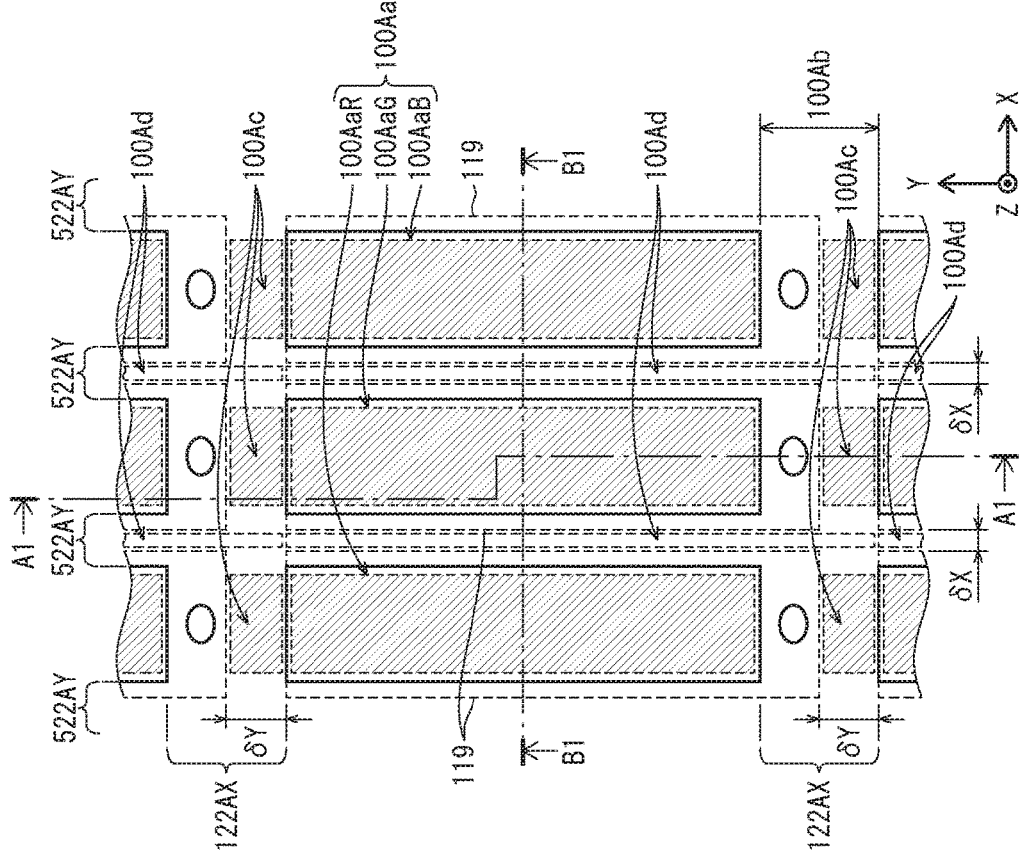
FIG. 14B is an enlarged plan view of the portion X1 viewed from above an insulating layer 122A.
Figure 14A:
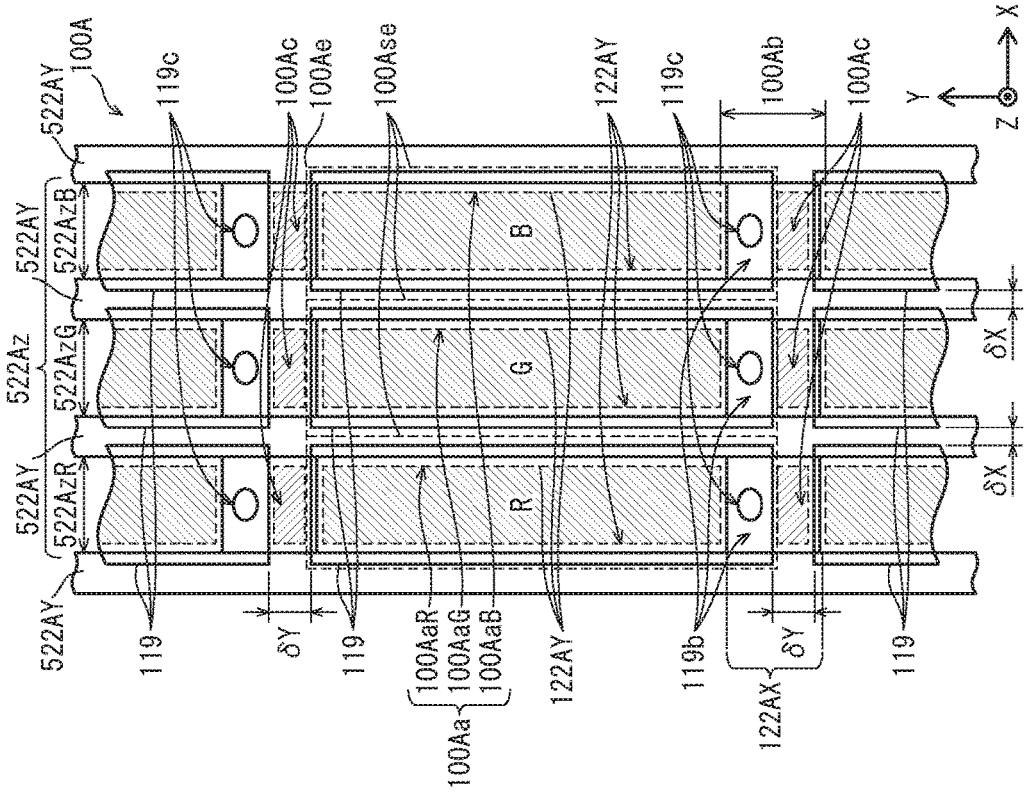
FIG. 14A is an enlarged plan view of a portion X1 in FIG. 13.
Figure 15:
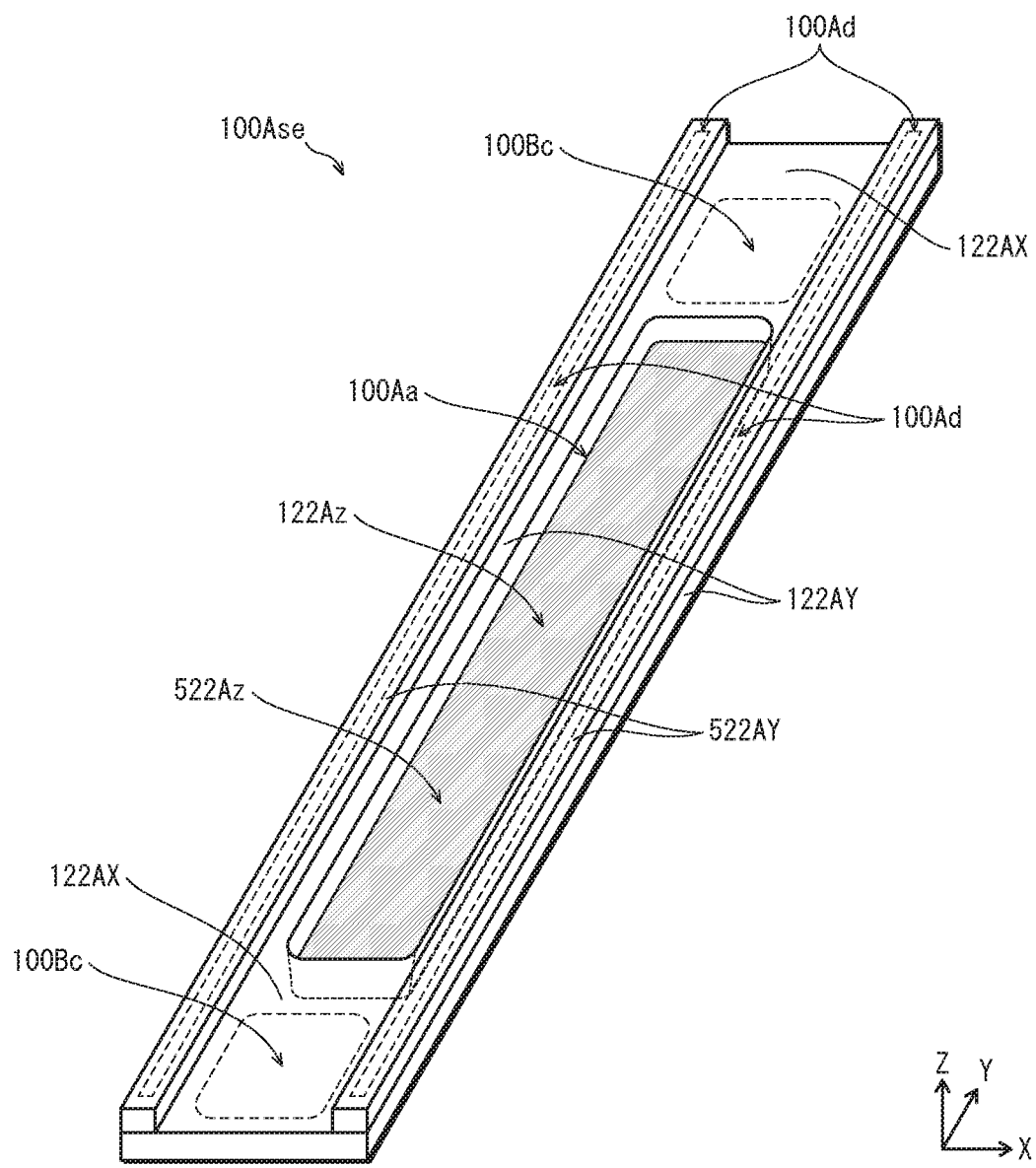
FIG. 15 is a perspective view from an oblique angle above a portion of the insulating layer 122A corresponding to a subpixel 100Ase of an organic EL display element 100A.
Figure 16:
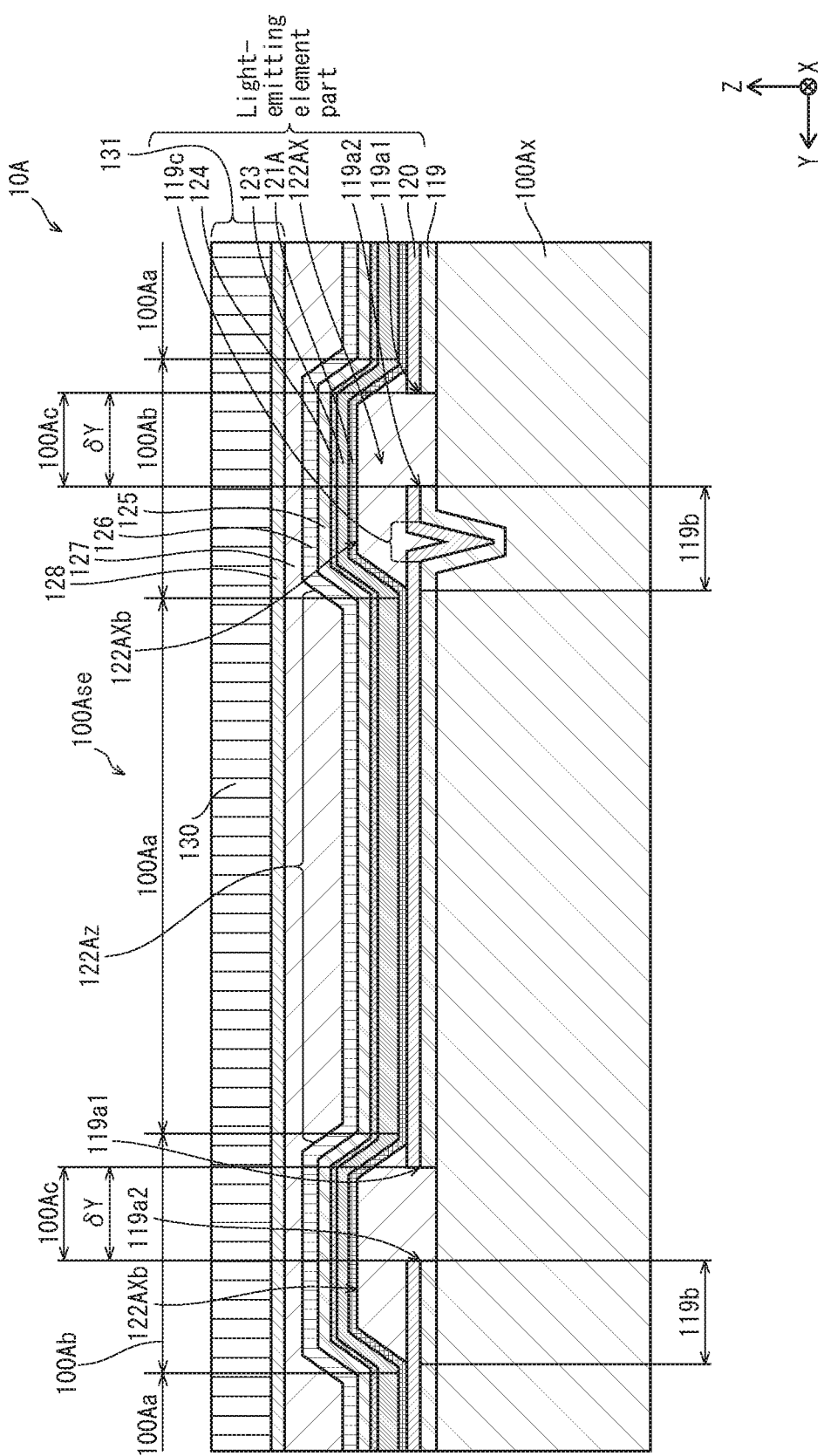
FIG. 16 is a schematic cross-sectional view taken along a line A1-A1 in FIG. 14B.
Figure 17:
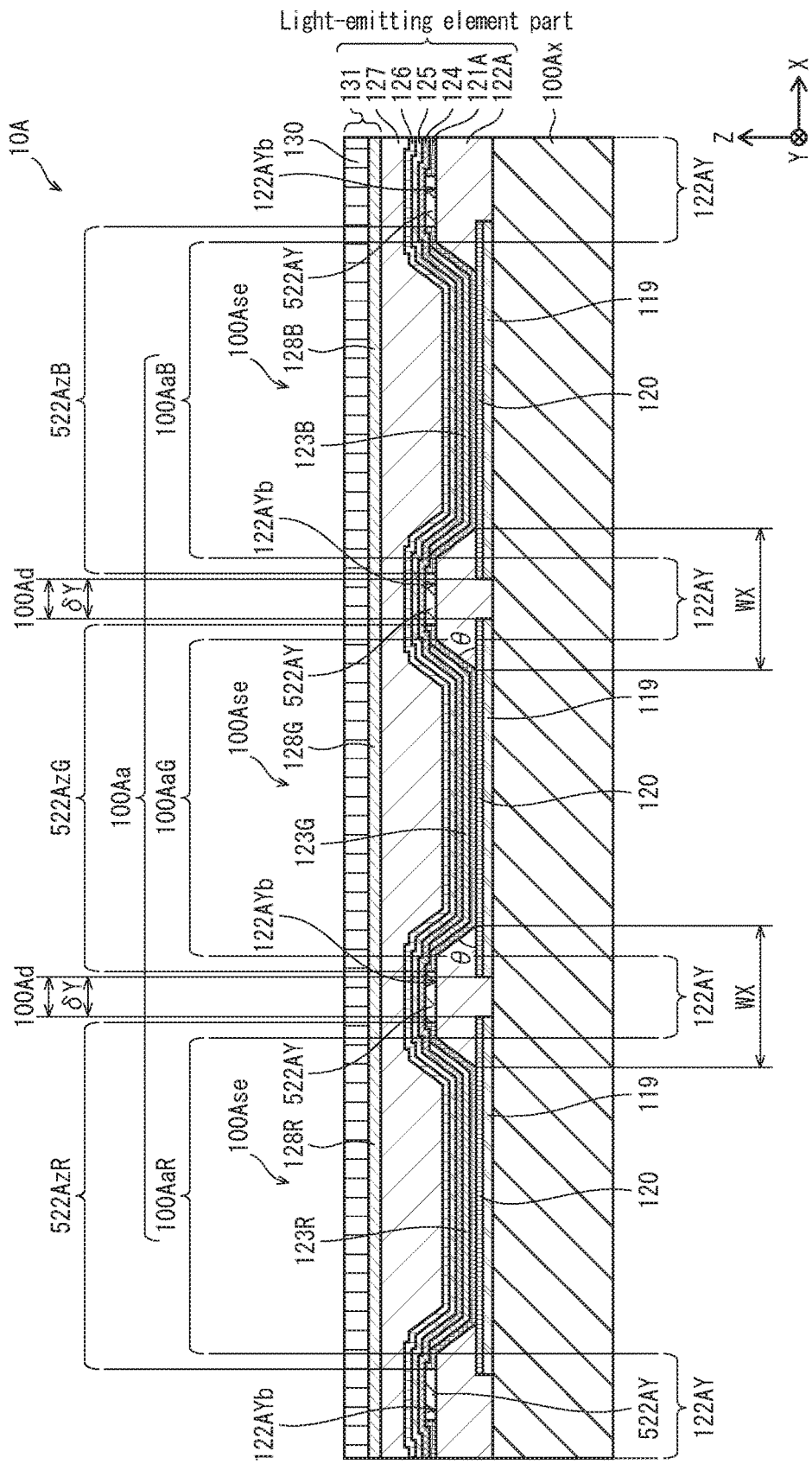
FIG. 17 is a schematic cross-sectional view taken along a line B1-B1 in FIG. 14B.

FIG. 13 is a schematic plan view showing a portion of the display panel 10A. FIG. 14A is an enlarged plan view of a portion X1 in FIG. 13, and FIG. 14B is an enlarged plan view of the portion X1 viewed from above the insulating layer 122A. FIG. 15 is a perspective view from an oblique angle above a portion of the insulating layer 122A corresponding to a subpixel 100Ase of an organic EL display element 100A. FIG. 16 is a schematic cross-sectional view taken along a line A1-A1 in FIG. 14B. FIG. 17 is a schematic cross-sectional view taken along a line B1-B1 in FIG. 14B.

First, the shape of the insulating layer 122A in the display panel 10A is described.

In the display panel 10A as shown in FIG. 13, the pixel electrode layers 119 are arranged in a matrix on the substrate 100Ax, and the insulating layer 122A is formed so as to cover the pixel electrode layers 119. Material and thickness of the insulating layer 122A are the same as those in the display panel 10.

The insulating layer 122A is layered above the pixel electrode layers 119 which are arranged in a matrix. The insulating layer 122A has rectangular openings 122Az slightly inside the row and column outer edges of the pixel electrode layers 119.

A rectangular region between the row and column outer edges of each opening 122Az is the self-luminous region 100Aa where light is emitted by organic compound. Here, among gaps between the self-luminous regions 100Aa, a gap in the row direction between each two self-luminous regions 100Aa that are arranged in the column direction is referred to as column insulating sublayer 122AY, and a gap in the column direction between each two self-luminous regions 100Aa that are arranged in the row direction is referred to as row insulating sublayer 122AX. Then, the column outer edges of the self-luminous regions 100Aa are defined by the column outer edges of the row insulating sublayers 122AX, and the row outer edges of the self-luminous regions 100Aa are defined by the row outer edges of the column insulating layers 122AY.

The row insulating sublayers 122AX extending in the row direction (the X-direction in FIG. 13, FIG. 14A, and FIG. 14B) are each arranged in the column direction above the column outer edges of two pixel electrode layers 119 that are adjacent in the column direction and above a region adjacent to the column outer edges. A region where each row insulating sublayer 122AX is formed is a non-self-luminous region 100Ab. In the display panel 10A as shown in FIG. 13, FIG. 14A, and FIG. 14B, the self-luminous regions 100Aa and the non-self-luminous regions 100Ab are alternately arranged in the column direction. In each non-self-luminous regions 100Ab, a connection concave part 119c (contact hole) connects the pixel electrode layer 119 and the source $S_1$ of the TFT, and a contact region 119b (contact window) is provided on the pixel electrode layer 119 for electrically connecting to the pixel electrode layer 119.

The display panel 10A further includes banks that are arranged in lines on the insulating layer 122A. A plurality of column banks 522AY extending in the column direction (the Y-direction in FIG. 13, FIG. 14A, and FIG. 14B) are arranged, on the column insulating layers 122AY, in the row direction above the row outer edges of two pixel electrode layers 119 that are adjacent in the row direction and above a region adjacent to the row outer edges.

A gap 522Az exists between adjacent column insulating sublayers 522AY. The display panel 10A includes a large number of column banks 522AY and gaps 522Az that are alternately arranged.

The display panel 10A has three types of self-luminous regions 100Aa, namely, self-luminous regions 100AaR, 100AaG, and 100AaB that emit red light, green light, and blue light, respectively (hereinafter, referred to collectively as self-luminous regions 100Aa when no distinction is made therebetween). The gaps 522Az include red gaps 522AzR, green gaps 522AzG, and blue gaps 522AzB that correspond to the self-luminous regions 100AaR, 100AaG, and 100AaB, respectively (hereinafter, referred to collectively as gaps 522Az when no distinction is made therebetween). A unit pixel 100Ae in color display is composed of one set of three subpixels 100Ase corresponding to the self-luminous regions 100AaR, 100AaG, and 100AaB that are arranged in the row direction.

In the display panel 10A, a column interval $\delta Y$ between the pixel electrode layers 119 is 20% or less of the length in the column direction of the pixel electrode layers 119. Accordingly, as shown in FIG. 13, FIG. 14A, FIG. 14B, and FIG. 15, the length in the column direction of an inter-region 100Ac, which corresponds to the column interval $\delta Y$ between the pixel electrode layers 119 in the non-self-luminescent region 100Ab where the insulating layer 122AX is formed, is also 20% or less of the length in the column direction of the pixel electrode layer 119.

Thus, in the display panel 10A, the inter-regions 100Ac has an area that is 30% or less of the area of the self-luminous regions 100Aa.

Next, description is given on the layering order of the hole transport layer 121A and the row insulating sublayers 122AX in the display panel 10A.

In the display panel 10A, the hole transport layer 121A is layered on the row insulating sublayers 122AX and on the hole injection layers 120 in the openings 122Az. The hole transport layer 121A is in contact with the hole injection layers 120 on the bottom of the openings 122Az. The hole transport layer 121A is formed by applying an ink containing material of the hole transport layer 121A onto the inside of the gaps 522Az, which are defined by the column banks 522Y, using the ink jet method, and then baking the ink. Alternatively, the hole transport layer 121A is formed by depositing a metal oxide film (for example, tungusten oxide film) using the sputtering method. Then, the film may be patterned in units of pixel using the photolithography method and the etching method. Furthermore, the light-emitting layers 123 are formed by applying an ink containing material of the light-emitting layers 123 onto the hole transport layer 121A in the gaps 522Az, which are defined by the column banks 522AY, using the ink jet method, and then baking the ink.

2. Summary

As described above, the display panel 10A relating to Embodiment 2 includes a plurality of subpixels 100se arranged in a matrix, the display panel 10A comprising: a substrate 100x; a plurality of pixel electrode layers 119 that are made of a light-reflective material and are arranged on the substrate 100x in a matrix; an insulating layer 122A that is provided at least above row and column outer edges 119a of the pixel electrode layers 119 and above inter-regions 100c and 100d on the substrate 100x between the row and column outer edges 119a; an organic functional layer 120, 121, 123, and 124 that is provided above the pixel electrode layers 119; and a counter electrode layer that is made of a light-transmissive material and is provided above the organic functional layer 120, 121, 123, and 124, wherein the organic functional layer 120, 121, 123, and 124 includes a plurality of light-emitting layers 123 that are provided in regions above the pixel electrode layers 119 where the insulating layer 122A is not provided, the light-emitting layers 123 causing organic electroluminescence, and the insulating layer 122A has an optical density of 0.5 to 1.5 in a direction of the substrate 100x when viewed in plan. The display panel 10A may further comprise a plurality of column banks 522AY that are provided, on part of the insulating layer 122A, at least above the row outer edges 119a3 and 119a4 of the pixel electrode layers 119 and above the inter-regions 100c and 100d on the substrate 100x between the row outer edges 119a3 and 119a4.

With these configurations, in a display panel adopting an insulating layer having a so-called lattice shape, it is possible to suppress a decrease in display contrast due to reflection of external light at the outer edges 119a of the pixel electrode layers 119.

Also, in the display panel 10A, the insulating layer 122A may have a higher optical density than the column banks 522AY. Even in the case where an addition rate of black pigment in the column banks 522AY is decreased in order to increase liquid repellency of the light-emitting layers 123 against ink, it is possible to suppress a decrease in display contrast due to reflection of external light at the outer edges 119a of the pixel electrode layers 119 by increasing the addition rate of black pigment in the column insulating sublayers 122AY which are arranged on the column banks 522AY thereby to ensure a certain optical density.

Also, in the display panel 10A, the column banks 522AY may have a higher liquid repellency against an organic solvent than the insulating layer 122A. Alternatively, the column banks 522AY may not contain black pigment. With these configurations, it is possible to form the column banks 522AY and the column insulating sublayers 122AY, which are arranged on the column banks 522AY, by using different materials, thereby independently setting the addition rate of black pigment in the column banks 522AY and the column insulating sublayers 122AY. This facilitates appropriate control on liquid repellency of the light-emitting layers 123 against ink. Specifically, even in the case where the column insulating layers 122AY and the row insulating sublayers 122AX, which are layered on the upper surface of the substrate 100Ax, are made of the same material, the following configurations are easily achieved: the addition rate of black pigment in the column banks 522AY is decreased, and thereby the column banks 522AY define the row outer edges of the light-emitting layers 123 which are formed by stemming the flow of the ink containing organic compound as the material of the light-emitting layers 123; and the addition rate of black pigment in the row insulating sublayers 122AX is increased, and thereby the row insulating sublayers 122AX control the flow in the column direction of the ink containing organic compound as the material of the light-emitting layers 123.

<Embodiment 3>

In the display panel 10 relating to Embodiment 1, the pixel electrode layers 119 are arranged on the substrate 100x in a matrix with the row interval δX therebetween and the column interval δY therebetween. Furthermore, the insulating layer 122 is formed so as to cover the pixel electrode layers 119. The inter-regions 100c, which have a length in the column direction between each two adjacent pixel electrode layers 119 corresponding to the column interval δY, have an area that is 30% or less of the area of the self-luminous regions 100a.

However, the insulating layer 122 only needs to be formed above the row and column outer edges of the pixel electrode layers 119, and the length of the column interval δY may be appropriately modified.

In an organic EL display panel 10B relating to Embodiment 3, a column interval δY between each two pixel electrode layers 119B covered with row insulating sublayers 122BX is substantially equal to the length of the pixel electrode layers 119B in the column direction. Inter-regions 100Bc have an area that is 10% to 120% of the area of self-luminous regions 100a. These points are differences from Embodiment 1.

The following describes the display panel 10B.

1. Configuration of Display Panel 10B

Figure 18:
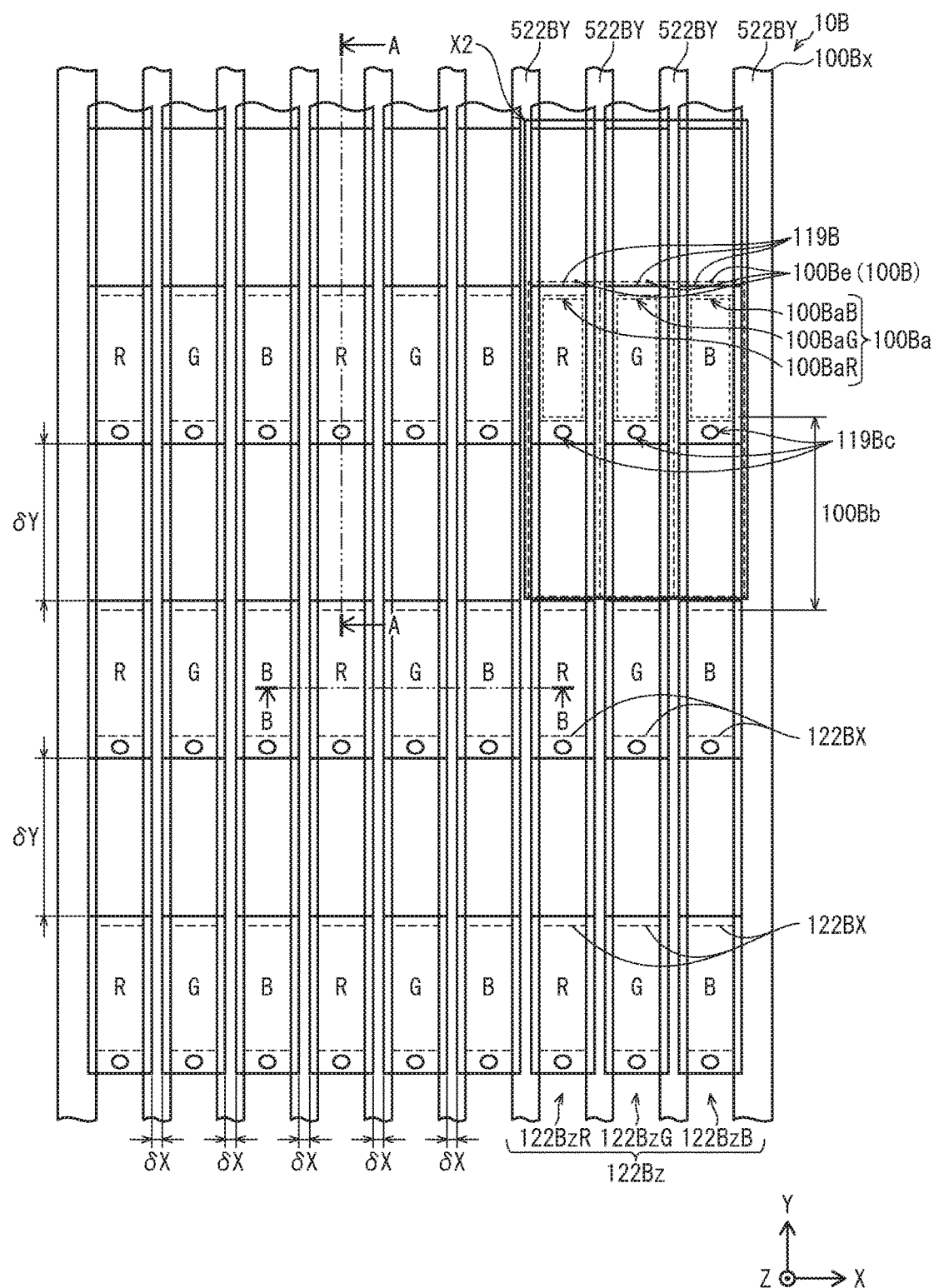
FIG. 18 is a schematic plan view showing a portion of an organic EL display panel 10B.
Figure 19:
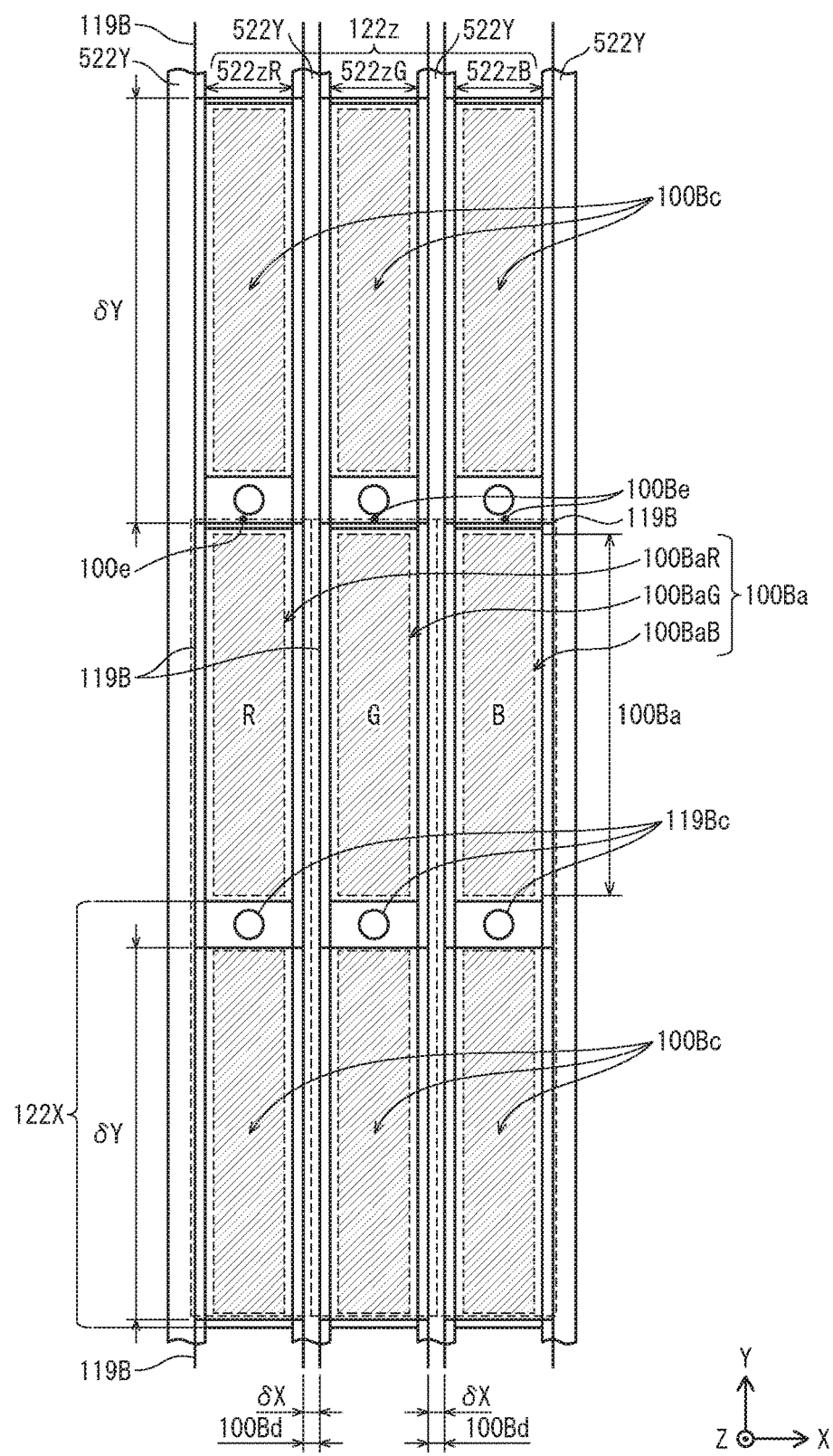
FIG. 19 is an enlarged plan view of a portion X2 in FIG. 18.
Figure 20:
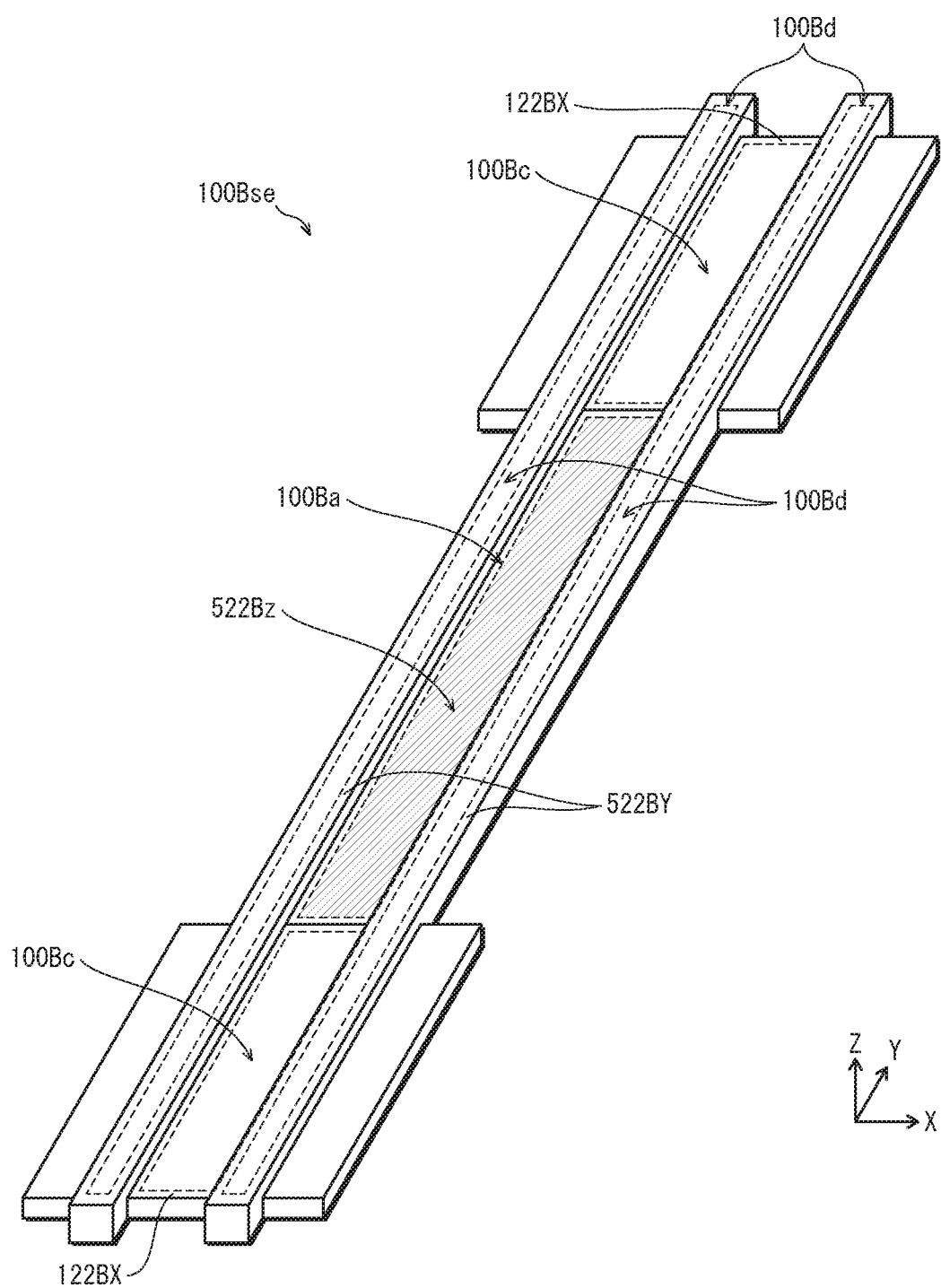
FIG. 20 is a perspective view from an oblique angle above a portion of an insulating layer 122B corresponding to a subpixel 100Bse of an organic EL display element 100B.

The display panel 10B differs from that in Embodiment 1 in terms of material of a substrate 100Bx, arrangement of the pixel electrode layers 119B, and the shape of an insulating layer 122B in plan view. Accordingly, description is given on these configurations relating to the display panel 10B. Configuration other than the above is the same as the display panel 10, and accordingly the same reference numbers are appended and description thereof is omitted. FIG. 18 is a schematic plan view showing a portion of the display panel 10B. FIG. 19 is an enlarged plan view of a portion X2 in FIG. 18. FIG. 20 is a perspective view from an oblique angle above a portion of the insulating layer 122B corresponding to a subpixel 100Bse of an organic EL display element 100B.

First, the substrate 100Bx is a supporting member for the display panel 10B, and is a film made of a flexible and light-transmissive material. A base material of the substrate 100Bx is an electrically insulating material such as a resin material. For example, polyimide, polyester, polyamide, polycarbonate, or polyethylene terephthalate is used.

Next, the arrangement of the pixel electrode layers 119B is described. The pixel electrode layers 119B are rectangular and plate-like. The pixel electrode layers 119B are arranged on the substrate 100Bx with the row intervals δX therebetween, and with the column intervals δY therebetween in the gaps 522Bz. In the display panel 10B as shown in FIG. 18 and FIG. 19, the interval δY between each two pixel electrode layers 119B that are adjacent in the column direction is longer than that in the display panel 10, and is substantially equal to the length of the pixel electrode layer 119B in the column direction. This point is a difference from the display panel 10. Accordingly, the inter-regions 100Bc, which has a length in the column direction equal to the interval δY, has an area that is 10% to 120% of an area of the self-luminous regions 100B.

The display panel 10B includes the insulating layer 122B having a so-called line shape, like in the display panel 10. Column insulating sublayers 522BY extend in the column direction (the Y-direction in FIG. 18 and FIG. 19), and are each arranged in the row direction above row outer edges of two pixel electrode layers 119B that are adjacent in the row direction and above a region adjacent to the row outer edges. Row insulating sublayers 122BX extend in the row direction (the X-direction in FIG. 18 and FIG. 19), and are each arranged above column outer edges of two pixel electrode layers 119B that adjacent in the column direction with the interval δY therebetween and above a region adjacent to the column outer edges. In the display panel 10B as described above, the interval δY is substantially equal to the length of the pixel electrode layer 119B in the column direction. Accordingly, as shown in FIG. 18, FIG. 19, and FIG. 20, the length in the column direction of an inter-region 100Bc, which corresponds to the column interval δY in the non-self-luminescent region 100b between the pixel electrode layers 119B where the row insulating sublayer 122BX is provided, is also substantially equal to the length of the pixel electrode layer 119B in the column direction. The inter-region 100Bc corresponds to the column interval δY of the non-self-luminescent region 100Bb where the row insulating sublayer BX is formed.

Therefore, in the display panel 10B, the inter-regions 100Bc has an area that is 10% to 120%, preferably 30% to 100% of the area of the self-luminous regions 100Ba. In the present embodiment, the area ratio is 90% to 100%.

2. Manufacturing Method of Display Device 1B

The following describes a method of manufacturing an organic EL display device 1B employing the display panel 10B with reference to FIG. 21A to FIG. 21F. FIG. 21A to FIG. 21F are cross sections showing processes in manufacture of the display device 1B.

Figure 21A:
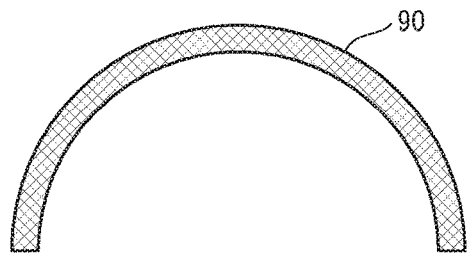
FIG. 21A to FIG. 21F are cross-sectional views showing processes in manufacture of an organic EL display device 1B.
Figure 21D:
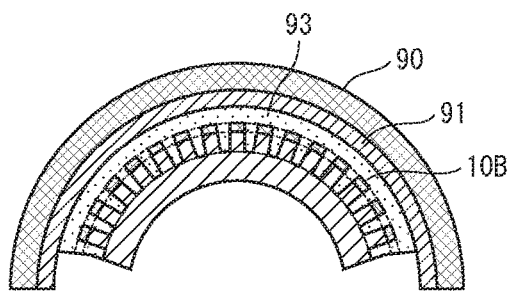
Figure 21B:
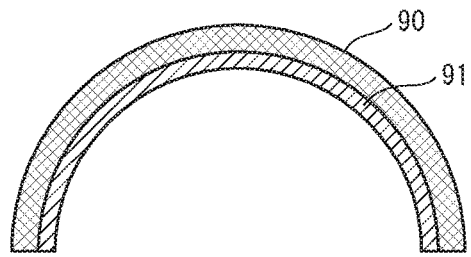

First, a curved substrate 90 to be mounted is prepared (FIG. 21A). A sealing layer 91 is formed by performing vapor deposition of a light-transmissive material such as silicon nitride (SiN) and silicon oxynitride (SiON) on an inner surface of the substrate 90 (FIG. 21B). In addition to or instead of silicon nitride (SiN) and silicon oxynitride (SiON), a sealing resin layer may be provided by using a resin material such as acrylic resin and silicone resin.

Figure 21E:
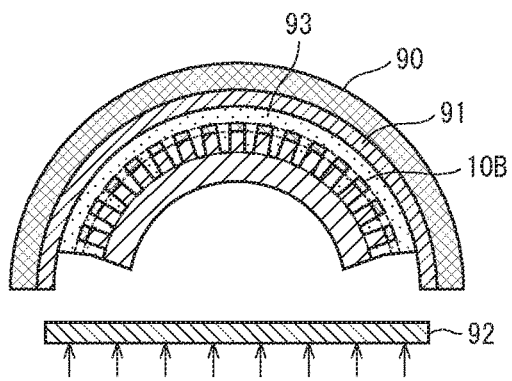
Figure 21C:
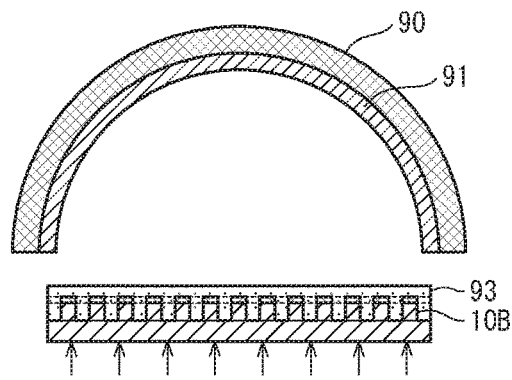

Next, a bond layer 93 that is made for example of a resin adhesive is bonded to the side of a display surface of the display panel 10B (FIG. 21C). The display panel 10B is bonded via the bond layer 93 to the inner surface of the substrate 90 on which the sealing layer 91 is formed using a vacuum molding method or the like, and the bond layer 93 is cured at a temperature that does not influence organic EL elements, for example at 100 degrees Celsius or lower (FIG. 21D).

Next, a sealing layer 92 is formed to cover the display panel 10B by performing vapor deposition of silicon nitride (SiN), silicon oxynitride (SiON), or the like from a rear surface of the display panel 10B (FIG. 21E). In addition to or instead of silicon nitride (SiN) and silicon oxynitride (SiON), a sealing resin layer may be provided by using a resin material such as acrylic resin and silicone resin.

Figure 21F:
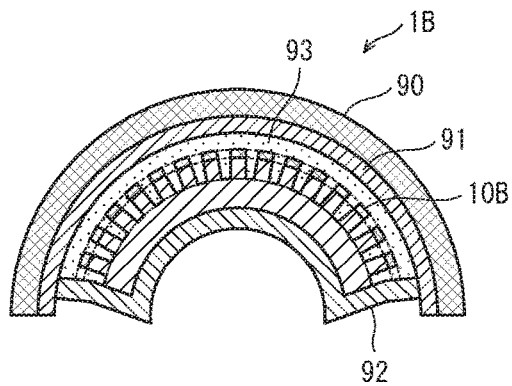

The display device 1B is complete through these processes (FIG. 21F).

3. Use Example of Display Device 1B

Figure 22:
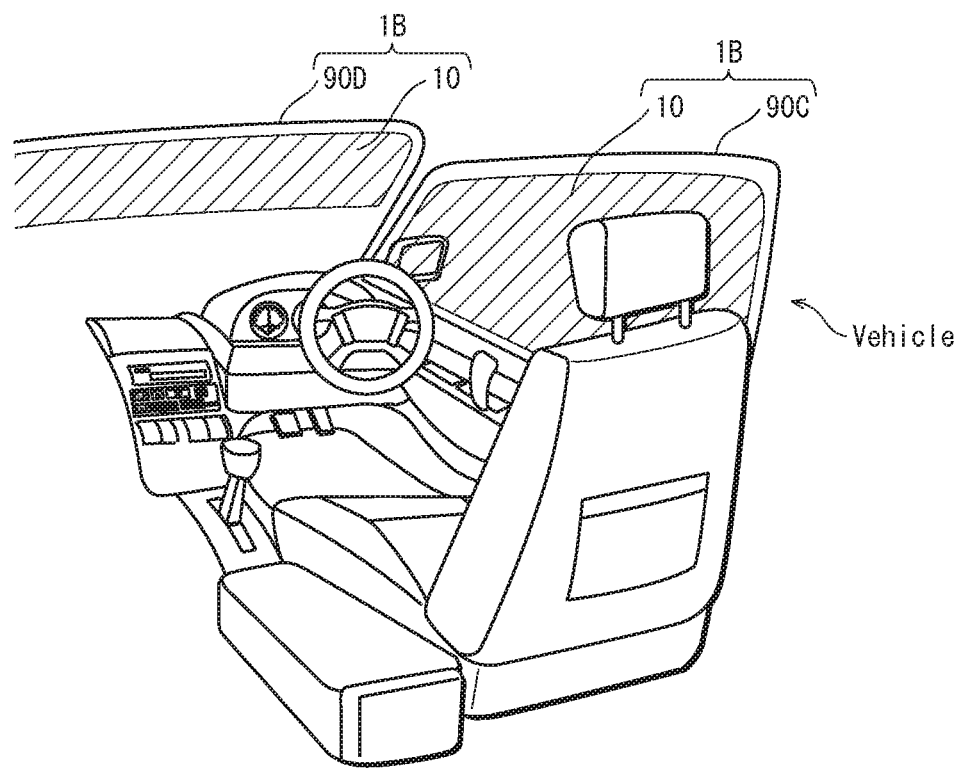
FIG. 22 is a schematic diagram showing a use example of the organic EL display device 1B.

A use example of the display device 1B is described with reference to FIG. 22. FIG. 22 is a schematic diagram showing a use example of the display device 1B.

As shown in FIG. 22, the substrate 90 to be mounted is used for a side window 90C and a front window 90D of a vehicle. The display device 1B includes the display panel 10B that is mounted on respective inner surfaces of the curved windows 90C and 90D. This configuration allows a driver at a driving seat to simultaneously view images and information that are displayed on the display device 1B and road conditions through the windows 90C and 90D.

3. Summary

As described above, in the display panel 10B relating to Embodiment 3, when the substrate 100x is viewed in plan, in one subpixel 100Bse emitting red, green, or blue light, the inter-region 100Bc has an area that is 10% to 120% of an area of a self-luminescent region 100Ba on the pixel electrode layer 119B where the insulating layer 122B is not provided. With this configuration, an observer OP can selectively or simultaneously view light that enters from the rear surface of the display device 1B, transmits through the inter-regions 100c and 100d, and is emitted upward above the display device 1B and light that is emitted from the self-luminous regions 100a that are positioned at a peripheral part of the display device 1B.

With the configuration of the substrate 100x which is flexible, it is possible to attach the display device 1B to curved windows for driving and the like of vehicles thereby to display running information and the like on the display device 1B.

Also, the display panel 10B may further comprise an upper substrate that is made of a light-transmissive material and is provided above the counter electrode layer, wherein a light shielding layer is not provided on a part of the upper substrate above the row and column outer edges of the pixel electrode layers. With this configuration, it is not necessary to perform positional adjustment with a high precision in the display panel 10B for bonding the light shielding layer of the CF substrate 131 and the pixels of the rear panel to each other while relative positional relationship therebetween is maintained. Especially in the configuration in which the color filter layer 128 of a different color for each pixel is not provided on the CF substrate 131, positioning between the rear panel and the CF substrate 131 can be omitted. Moreover, even with the configuration in which the display panel 10B does not include the CF substrate 131, for example in the case where the display panel 10B is a transparent display, it is possible to suppress reflection of external light and improve the luminous efficiency.

<Modifications>

In the above embodiment, the display panels 10 is described. However, the present disclosure is not limited to the above embodiment except the essential characteristic compositional elements thereof. For example, the present disclosure also includes an embodiment obtained through various types of modifications which could be conceived of by one skilled in the art to the above embodiments, an embodiment obtained through any combination of the compositional elements and the functions in the above embodiments without departing from the spirit of the present disclosure, and so on. The following describes modifications of the display panels as examples of such embodiments.

(1) In the display panel 10, the upper substrate 130 which is made of a light-transmissive material is provided above the gaps 522z corresponding to the subpixels 100se of the R, G, and B colors, and the color filter layers 128 are provided on the upper substrate 130. Alternatively, the exemplified display panel 10 may have a configuration in which the upper substrate 130 which is made of a light-transmissive material is not provided and the color filter layers 128 are not provided above the gaps 522z. This realizes reduction of manufacturing costs in addition to suppression of external light reflection and improvement of luminous efficiency.

(2) In the display panel 10, the light-emitting layers 123 are continuous in the column direction above the row insulating sublayers. Alternatively, the light-emitting layers 123 may be discontinuous for each pixel above the row insulating sublayers. This configuration also realizes suppression of external light reflection and improvement of luminous efficiency.

(3) In the display panel 10, the light-emitting layers 123 of the subpixels 100se, which are arranged in the gaps 522z between the column insulating sublayers 522Y adjacent in the row direction, each emit light of a color different from adjacent one. On the other hand, the light-emitting layers 123 of the subpixels 100se, which are arranged in the gaps between the row insulating layers 122 X adjacent in the column direction, emit light of the same color. Alternatively, the light-emitting layers 123 of the subpixels 100se, which are adjacent in the row direction, may emit light of the same color, and the light-emitting layers 123 of the subpixels 100se, which are adjacent in the column direction, each may emit light of a color different from adjacent one. Further alternatively, the light-emitting layers 123 of the subpixels 100se, which are adjacent in the row direction, each may emit light of a color different from adjacent one, and the light-emitting layers 123 of the subpixels 100se, which are adjacent in the column direction, each may emit light of a color different from adjacent one. This configuration also realizes suppression of external light reflection and improvement of luminous efficiency.

(4) In the display panel 10, the CF substrate 131 is bonded via the bond layer 127 to the rear panel, which is composed of the substrate 100X and the layers ranging from the pixel electrode layers 119 to the sealing layer 126. In addition, a photo spacer (not shown) may be inserted between the CF substrate 131 and the rear panel.

The photo spacer is used mainly for adjusting an interval between the CF substrate 131 and the rear panel facing each other. The photo spacer may be in shape of a cylinder whose axis direction is the Z-direction, and have respective end portions in the Z-direction that are in abutment with the CF substrate 131 and the rear panel. The shape of the photo spacer is not limited to be a cylinder, and may be for example a rectangular solid, a sphere, or the like. Alternatively, the photo spacer may be rectangular. A known material may be used for the photo spacer. For example, a highly transparent resin material such as methacrylic acid ester may be used.

(5) Other Modifications

The display panel 10 relating to the above embodiment includes the pixels 100e of the three colors of red, green, and blue. However, the present disclosure is not limited to this. For example, the light-emitting layers may emit light of a single color, or emit light of four colors of red, green, blue, and yellow.

Also, the pixels 100e are arranged in a matrix in the above embodiments. However, the present disclosure is not limited to this. The effect of the present disclosure is exhibited also in the configuration in which in the case for example where an interval of the pixel region is one pitch, the pixel region is offset in the column direction by half pitch between adjacent gaps. In display panels with increasingly high-definition, it is difficult to visually discriminate some differences in the column direction. Accordingly, a straight (or zigzag) irregular thickness with a certain range is viewed as a stripe-shaped one. Thus, in such a case, it is possible to improve the display quality of display panel by suppressing an irregular luminance in a zigzag shape.

Also, in the display panel 10, the pixel electrode layer 119 is provided between each two of all the gaps 522z. However, the present disclosure is not limited to this. For example, some of the gaps 522z may not have the pixel electrode layer 119 therebetween in order to form a bus bar or the like.

Also, in the above embodiments, the hole injection layer 120, the hole transport layer 121, the light-emitting layers 123, and the electron transport layer 124 are provided between the pixel electrode layers 119 and the counter electrode layer 125. However, the present disclosure is not limited to this. For example, only the light-emitting layers 123 may be provided between the pixel electrode layers 119 and the counter electrode layer 125, without providing the hole injection layer 120, the hole transport layer 121, and the electron transport layer 124. Alternatively, a hole injection layer, a hole transport layer, an electron transport layer, an electron injection layer, and so on may be included, or some or all of these layers may be simultaneously included, for example. Moreover, all of these layers do not need to be made of organic compound, and alternatively some of the layers may be made of inorganic substance or the like.

Also, in the above embodiments, the light-emitting layers 123 are formed using a wet deposition method such as the printing method, the spin coating method, and the ink jet method. However, the present disclosure is not limited to this. For example, a dry deposition method may be used such as the vacuum deposition method, an electron beam deposition method, the sputtering method, a reactive sputtering method, an ion plating method, and a chemical vapor deposition method. Moreover, a known material may be appropriately adopted for the materials of the components.

Also, in the above embodiments, the pixel electrode layers 119 as anodes are provided in the lower part of the organic EL element unit so as to be connected with the source electrodes of the TFTs. Alternatively, the counter electrode layer and the anodes may be provided in the lower part and the upper part of the organic EL element unit, respectively. In this case, the cathode that is provided in the lower part is connected with the drain electrodes of the TFTs.

Also, the two transistors $Tr_1$ and $Tr_2$ are provided for each subpixel 100se in the above embodiments. However, the present disclosure is not limited to this. For example, one transistor may be provided for each subpixel, or three or more transistors may be provided for each subpixel.

Furthermore, an EL display panel of the top-emission type is exemplified in the above embodiments. However, the present disclosure is not limited to this. For example, the present disclosure may be applied to a display panel of a bottom-emission type. In this case, the configurations may be appropriately modified.

<Supplements>

The embodiments described above each show a specific preferred example of the present disclosure. The numerical values, the shapes, the materials, the structural elements, the arrangement and connection status of the structural elements, the processes, the order of the processes, and so on described in the above embodiments are just examples, and do not intend to limit the present disclosure. Also, processes among the structural elements in the embodiments, which are not described in the independent claims representing the most generic concept of the present disclosure, are explained as arbitrary structural elements of a more preferred embodiment.

Furthermore, the order of performing the above processes is exemplification for specifically describing the present disclosure, and the processes may be performed in an order different from the above one. Moreover, part of the above processes may be performed simultaneously (in parallel) with other process.

Also, the scale reduction of the structural elements shown in the figures in the above embodiments sometimes differs from the actual scale reduction for easy understanding of the present disclosure. Furthermore, the present disclosure is not limited by the description of the above embodiments, and may be appropriately modified without departing from the scope of the present disclosure.

Moreover, at least part of the functions of the above embodiments and modifications may be combined with each other.

Furthermore, the present disclosure also includes embodiments obtained through various types of modifications that could be conceived of by one skilled in the art to the above embodiments.

The organic EL display panel and the organic EL display device relating to the present disclosure are broadly utilizable to devices such as television sets, personal computers, and mobile phones, or various types of electrical devices having display panels.

Although the technology pertaining to the present disclosure has been fully described by way of examples with reference to the accompanying drawings, it is to be noted that various changes and modifications will be apparent to those skilled in the art. Therefore, unless such changes and modifications depart from the scope of the present disclosure, they should be construed as being included therein.

The invention claimed is:

1. An organic electroluminescence (EL) display panel, including a plurality of pixels arranged in a matrix, the organic EL display panel comprising:
   a substrate;
   a plurality of pixel electrode layers that are made of a light-reflective material and are arranged on the substrate in a matrix;
   an insulating layer that is provided at least above row and column outer edges of the pixel electrode layers and above inter-regions on the substrate between the row and column outer edges;
   an organic functional layer that is provided above the pixel electrode layers; and
   a counter electrode layer that is made of a light-transmissive material and is provided above the organic functional layer,
   wherein the organic functional layer includes a plurality of light-emitting layers that are provided in regions above the pixel electrode layers where the insulating layer is not provided, the light-emitting layers causing organic electroluminescence,
   wherein the insulating layer has an optical density of 0.5 to 1.5 in a direction of the substrate when viewed in plan,
   wherein the insulating layer includes
      a plurality of column insulating sublayers that are provided at least above the row outer edges of the pixel electrode layers and above the inter-regions on the substrate between the row outer edges; and
      a plurality of row insulating sublayers that are provided at least above the column outer edges of the pixel electrode layers and above the inter-regions on the substrate between the column outer edges, and
      the light-emitting layers are each provided in a gap between two adjacent of the column insulating sublayers, and
   wherein the row insulating sublayers have a higher optical density than the column insulating sublayers.

2. The organic EL display panel of claim 1,
   wherein the substrate is made of a light-transmissive material, and
   light entering from a rear surface of the substrate at least transmits through the inter-regions and is emitted upward.

3. The organic EL display panel of claim 1,
   wherein the row insulating sublayers have a lower liquid repellency against an organic solvent than the column insulating sublayers.

4. The organic EL display panel of claim 3,
   wherein the light-emitting layers are continuous on the row insulating sublayers in the column direction.

5. The organic EL display panel of claim 1,
   wherein when the substrate is viewed in plan, in one subpixel emitting red, green, or blue light, the inter-region has an area that is 10% to 120% of an area of a self-luminescent region on the pixel electrode layer where the insulating layer is not provided.

6. The organic EL display panel of claim 1, further comprising:
   an upper substrate that is made of a light-transmissive material and is provided above the counter electrode layer,
   wherein a light shielding layer is not provided on a part of the upper substrate above the row and column outer edges of the pixel electrode layers.

7. The organic EL display panel of claim 1,
   wherein the substrate is flexible.

8. An organic electroluminescence (EL) display panel, including a plurality of pixels arranged in a matrix, the organic EL display panel comprising:
   a substrate;
   a plurality of pixel electrode layers that are made of a light-reflective material and are arranged on the substrate in a matrix;
   an insulating layer that is provided at least above row and column outer edges of the pixel electrode layers and above inter-regions on the substrate between the row and column outer edges;
   an organic functional layer that is provided above the pixel electrode layers;
   a counter electrode layer that is made of a light-transmissive material and is provided above the organic functional layer; and
   a plurality of column banks that are provided, on part of the insulating layer, at least above the row outer edges of the pixel electrode layers and above the inter-regions on the substrate between the row outer edges,
   wherein the organic functional layer includes a plurality of light-emitting layers that are provided in regions above the pixel electrode layers where the insulating layer is not provided, the light-emitting layers causing organic electroluminescence,
   wherein the insulating layer has an optical density of0.5 to 1.5 in a direction of the substrate when viewed in plan,
   wherein the insulating layer has a higher optical density than the column banks.

9. The organic EL display panel of claim 8,
   wherein the column banks have a higher liquid repellency against an organic solvent than the insulating layer.

10. The organic EL display panel of claim 8,
    wherein the substrate is made of a light-transmissive material, and
    light entering from a rear surface of the substrate at least transmits through the inter-regions and is emitted upward.

11. The organic EL display panel of claim 8,
    wherein when the substrate is viewed in plan, in one subpixel emitting red, green, or blue light, the inter-region has an area that is 10% to 120% of an area of a self-luminescent region on the pixel electrode layer where the insulating layer is not provided.

12. The organic EL display panel of claim 8, further comprising
an upper substrate that is made of a light-transmissive material and is provided above the counter electrode layer,
wherein a light shielding layer is not provided on a part of the upper substrate above the row and column outer edges of the pixel electrode layers.

13. The organic EL display panel of claim 8,
wherein the substrate is flexible.

14. An organic electroluminescence (EL) display panel, including a plurality of pixels arranged in a matrix, the organic EL display panel comprising:
a substrate:
a plurality of pixel electrode layers that are made of a light-reflective material and are arranged on the substrate in a matrix;
an insulating layer that is provided at least above row and column outer edges of the pixel electrode layers and above inter-regions on the substrate between the row and column outer edges;
an organic functional layer that is provided above the pixel electrode layers; and
a counter electrode layer that is made of a light-transmissive material and is provided above the organic functional layer,
wherein the organic functional layer includes a plurality of light-emitting layers that are provided in regions above the pixel electrode layers where the insulating layer is not provided, the light-emitting layers causing organic electroluminescence,
wherein the insulating layer has an optical density of 0.5 to 1.5 in a direction of the substrate when viewed in plan, and
wherein the insulating layer contains a resin binder and at least one component selected from carbon, molybdenum, and chromium.

15. The organic EL display panel of claim 14,
wherein the substrate is made of a light-transmissive material, and
light entering from a rear surface of the substrate at least transmits through the inter-regions and is emitted upward.

16. The organic EL display panel of claim 14,
wherein when the substrate is viewed in plan, in one subpixel emitting red, green, or blue light, the inter-region has an area that is 10% to 120% of an area of a self-luminescent region on the pixel electrode layer where the insulating layer is not provided.

17. The organic EL display panel of claim 14, further comprising:
an upper substrate that is made of a light-transmissive material and is provided above the counter electrode layer,
wherein a light shielding layer is not provided on a part of the upper substrate above the row and column outer edges of the pixel electrode layers.

18. The organic EL display panel of claim 14,
wherein the substrate is flexible.

* * * * *